US012811103B2

(12) United States Patent
Nagorny et al.

(10) Patent No.: US 12,811,103 B2
(45) Date of Patent: Nov. 24, 2026

(54) STACKABLE PLASMA SOURCE FOR PLASMA PROCESSING

(71) Applicant: APPLIED MATERIALS, INC., Santa Clara, CA (US)

(72) Inventors: Vladimir Nagorny, Tracy, CA (US); Rene George, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 657 days.

(21) Appl. No.: 17/842,671

(22) Filed: Jun. 16, 2022

(65) Prior Publication Data

US 2023/0411122 A1 Dec. 21, 2023

(51) Int. Cl.
*H01J 37/32* (2006.01)

(52) U.S. Cl.
CPC .. *H01J 37/32348* (2013.01); *H01J 37/32577* (2013.01); *H01J 37/32541* (2013.01); *H01J 37/32568* (2013.01)

(58) Field of Classification Search
CPC ...... H01J 37/32348; H01J 37/32-3299; C23C 16/45536-45542; C23C 16/50-517
See application file for complete search history.

(56) References Cited

U.S. PATENT DOCUMENTS

| | | | |
|---|---|---|---|
| 6,236,163 B1 | 5/2001 | Maishev et al. | |
| 6,238,526 B1 | 5/2001 | Maishev et al. | |
| 11,466,366 B2 | 10/2022 | Tabata et al. | |
| 2003/0007910 A1 | 1/2003 | Diamant Lazarovich et al. | |
| 2008/0308409 A1* | 12/2008 | Brcka | H05H 1/46 422/186.29 |
| 2010/0147219 A1* | 6/2010 | Hsieh | C01B 33/035 118/723 R |
| 2011/0189057 A1 | 8/2011 | Keras | |
| 2011/0209725 A1 | 9/2011 | Kim | |
| 2014/0217882 A1* | 8/2014 | Yagi | B01J 19/088 313/268 |

(Continued)

FOREIGN PATENT DOCUMENTS

| | | |
|---|---|---|
| KR | 20210132275 A | 11/2021 |
| WO | 2020/168382 A1 | 8/2020 |
| WO | 2021073107 A1 | 4/2021 |

OTHER PUBLICATIONS

International Search Report and Written Opinion for International application No. PCT/US2023/025320 dated Oct. 6, 2023, 12 pages.

*Primary Examiner* — Kurt Sweely
(74) *Attorney, Agent, or Firm* — Lowenstein Sandler LLP

(57) ABSTRACT

A system, method, and apparatus for processing substrates. A plasma generation assembly includes a support structure configured to be disposed within a processing chamber, the support structure forming a set of ducts. The plasma generation assembly further includes a plasma generation cell selectively removable from and selectively replaceable within one of set of ducts. The plasma generation cell includes a dielectric barrier discharge (DBD) structure. The DBD structure includes a set of electrodes disposed along a first dielectric surface and covered by a second dielectric layer. The DBD structure is configured to initiate plasma discharge within the processing chamber. The DBD structure further includes electrical terminals coupled the DBD structure with an electric driving network.

7 Claims, 16 Drawing Sheets

(56) References Cited

U.S. PATENT DOCUMENTS

| | | | | |
|---|---|---|---|---|
| 2015/0137677 | A1* | 5/2015 | Sohn | H01T 19/04 313/268 |
| 2015/0340207 | A1 | 11/2015 | Holbeche | |
| 2016/0053376 | A1* | 2/2016 | Nam | C23C 16/5096 118/723 R |
| 2017/0221682 | A1 | 8/2017 | Nishimura | |
| 2018/0002203 | A1* | 1/2018 | Yokoyama | H05H 1/2406 |
| 2020/0258717 | A1 | 8/2020 | Gandhiraman et al. | |
| 2020/0312630 | A1* | 10/2020 | Ramaswamy | H01J 37/32091 |
| 2021/0233748 | A1* | 7/2021 | Watanabe | C23C 16/452 |
| 2022/0384144 | A1* | 12/2022 | Long | H01J 37/32091 |
| 2024/0170261 | A1 | 5/2024 | Nagorny et al. | |

* cited by examiner

STACKABLE PLASMA SOURCE FOR PLASMA PROCESSING

RELATED APPLICATION

This application is also related to U.S. patent application Ser. No. 17/842,666 filed Jun. 16, 2022, entitled "Stackable Plasma Source For Plasma Processing."

TECHNICAL FIELD

The instant specification relates methods and systems for controlling plasma processing. Specifically, the instant specification relates to plasma processing using a stackable plasma source for plasma processing.

BACKGROUND

Plasma processing is widely used in the semiconductor industry. Plasma can modify a chemistry of a processing gas (e.g., generating ions, radicals, etc.), creating new species, without limitations related to the process temperature, generating a flux of ions to the wafer with energies from a fraction of an electronvolt (eV) to thousands of eVs. There are many kinds of plasma sources (e.g., capacitively coupled plasma (CCP), inductively coupled plasma (ICP), microwave generated plasma, electron cyclotron resonance (ECR), and the like) that cover a wide operational process range from a few mTorr to a few Torr.

A common plasma process specification today is a high uniformity of the process result (e.g., a uniformity across a wafer up to the very edge of the wafer). For example, process uniformity requirement in today's semiconductor manufacturing may include requirements around 1%-2% across the whole wafer, with exclusion of 1-3 mm from the edge. These stringent constraints continuously get even firmer as researchers look for new methods for controlling process uniformity and/or finding improvements to existing methods for controlling process uniformity. Different uniformity controlling methods may be effective for some processes and completely useless for others.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an exemplary embodiment, a plasma processing system includes a processing chamber, a gas distribution area and a support structure disposed within the processing chamber. The support structure forms a plurality of channels. The plasma processing system further includes a plasma generation cells disposed within the channels. Each plasma generation cell is selectively removable from the support structure. The plasma generation cell includes a plasma generating structure configured to be selectively activated or deactivated (e.g., activates and/or deactivates and configured to supply plasma related fluxes). The plasma generating structure supplies plasma related fluxes to a region of the processing chamber responsive to being activated. The plasma generation cell further includes a set of electrical connectors coupled to the plasma generation structure. The set of electrical connectors extend to a position outside the processing chamber. The set of electrical connectors are configured to receive electrical signal that selectively activate or deactivate the plasma generating structure.

In an exemplary embodiment, a plasma generation assembly includes a support structure configured to be disposed within a processing chamber. The support structure may form a plurality of channels. Each plasma generation cell includes a channel and a plasma generating structure configured to be selectively activated or deactivated. The plasma generating structure supplies plasma related fluxes to a region of the processing chamber responsive to being activated. The plasma generation cell further includes a set of electrical connectors coupled to the plasma generation structure. The set of electrical connectors extend to a position outside the processing chamber. The set of electrical connectors are configured to receive electrical signal that selectively activate or deactivate the plasma generating structure.

In an exemplary embodiment, a plasma generation assembly includes a plurality of plasma generation structures. Each plasma generation structure includes a first dielectric planar structure. The plasma generation structure further includes a first conducting planar structure disposed on the first dielectric planar structure. The plasma generation structure further includes a second dielectric planar structure disposed on the first conducting planar structure. The plasma generation structure further includes a second conducting planar structure disposed on the second dielectric planar structure. The plasma generation structure further includes a third dielectric planar structure disposed on the second conducting planar structure. The first dielectric planar structure, the first conducting planar structure, the second dielectric planar structure, the second conducting planar structure, and the third dielectric planar structure may together form a distribution of recesses. The plasma generation assembly may further include a set of electrical connectors coupled to the conducting planar structures of each plasma generating structure. Electrical connectors may be configured to selectively activate or deactivate any and all plasma generating structures. Each plasma generating structure supplies plasma related fluxes to the adjacent region of the processing chamber using the distribution of recesses responsive to being activated.

BRIEF DESCRIPTION OF THE DRAWINGS

The present disclosure is illustrated by way of example, and not by way of limitation in the figures of the accompanying drawings.

DETAILED DESCRIPTION

Figure 1A:
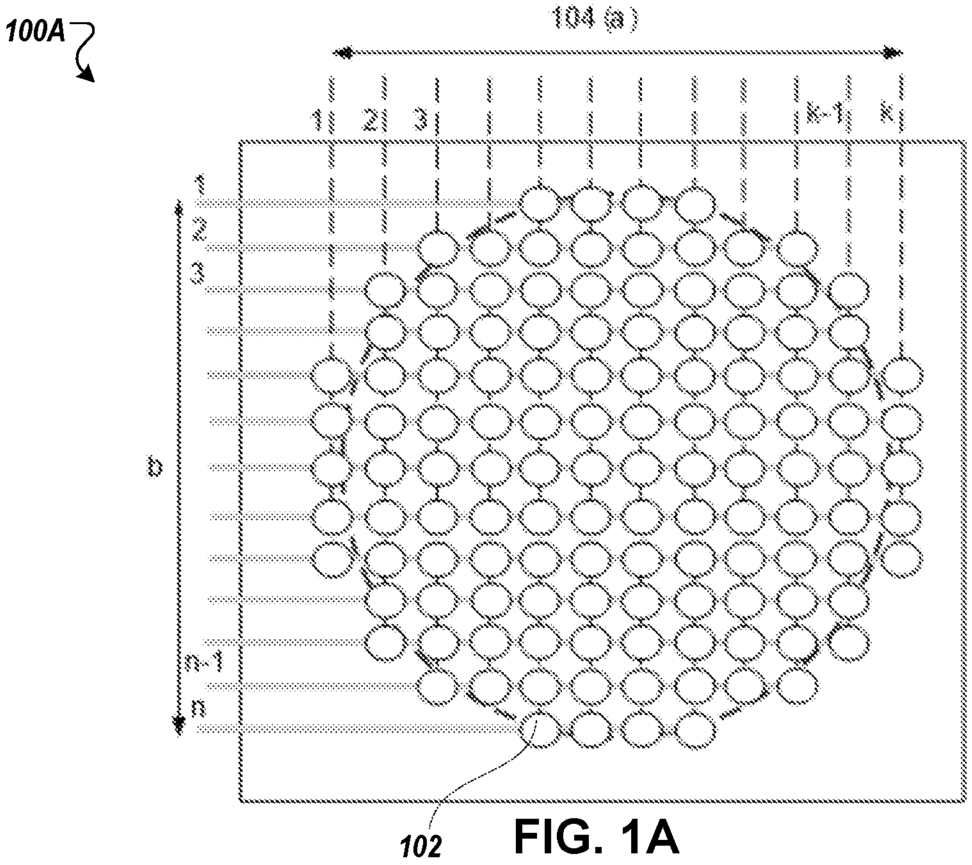
FIGS. 1A-D illustrate capability of a stackable plasma source to have different configurations of connecting and driving of the plasma source while keeping the same physical configuration of discharge elements, according to some embodiments.

A common requirement for a plasma process today is a high uniformity of a process result (e.g., a uniformity across a wafer up to the very edge of the wafer). This requirement is often very difficult to achieve, because it involves many factors, many of which interfere with others. Plasma uniformity, chamber design, wafer temperature distribution, design of the bias electrode, etc. are only part of those factors. Typical process uniformity requirement in today's semiconductor manufacturing is around 1%-2% across the whole wafer, with exclusion of 1-3 mm from the edge. Different uniformity controlling methods may be effective for some processes and completely useless for others. These stringent constraints that continuously get even firmer call for new methods for controlling process uniformity instead of or in addition to existing methods.

These problems can be mitigated, and in some cases eliminated if a traditional hardware architecture which uses a few powered elements (1-2 coils; 1-2 zone ESC, . . . ) and, respectively, very few controlling elements that control plasma globally, is replaced with a hardware that uses hundreds of controlled elements, each of which affects only a small local area of the wafer. An analog process control used in traditional systems can be replaced with a digital process control. Digital control is a native approach for control of a lot of identical controlled elements/cells (e.g. 200-1000 zones ESC, etc.) Contrary to analog systems, where those few elements operate for the same time, but energized to carefully adjusted/controlled levels, in a digitally controlled system one energize/activate every cell (e.g., pixel) to the same level (e.g. powered), however, the exposure time of each cell may be controlled.

For example, a common plasma source may be replaced with a 2D array of small identical plasma sources that cover the whole area above the substrate and powered by the same power supply. The controllable version of this array allows turning ON and OFF individual sources or zones, where each zone may contain several sources and the number of sources may differ from zone to zone. Controlling the time the individual zone or the source generates plasma (ON), one controls the process uniformity on the substrate. A difficulty of this approach lies in the manufacturing the panel that could survive vacuum condition, processing temperatures that can be anything from the room temperature to a few hundred Centigrade (e.g., 400 C-800 C). Integrity of the panel is also a potential difficulty. For example, there may somewhere appear a crack that will show up in some process conditions as a leak, arc, or particle generation which may necessitate replacement of the panel. Furthermore, the function of the panel may preclude testing of the panel until the panel is finished which can be costly to manufacturing resources and production time.

Aspects and implementation of the present disclosure address these and other potential shortcomings of this technology and systems using digital process control. Specifically, embodiments disclosed herein are directed to devices, systems, and processes using an assembly having a structure housing plasma generation cells separately placed and independently activated/deactivated. The panel may include a holding structure that maintains a distribution and alignment of the cells and a cover structure (e.g., cover structure forms a region of the processing chamber) over the panel to facilitate processing chamber condition (e.g., vacuum conditions) and process gas delivery. The individual cells may include plasma generating structures and support structures (e.g., stems) for maintaining a position, electrodes and gas injection sites for generating plasma. Aspects of the present disclosure may provide for individual testing of the plasma cells, testing of the support structure separate from the plasma generation cells, and/or individual manufacturing of the plasma generation cells and/or support structure. Some aspects of the present disclosure may provide digital processing control of the individual plasma generation cells such as independent activation and/or deactivation of plasma generating components (e.g., sets of electrodes and process gas delivery) in an arrangement (e.g., an array) of plasma generation cells.

In an exemplary embodiment, a plasma processing system includes a processing chamber and a support structure disposed within the processing chamber. The support structure forms a channel (e.g., a recess, a hole, an interior volume, a pocket, etc.). The plasma processing system further includes a plasma generation cell disposed within the channel. The plasma generation cell is selectively removable from the support structure. The plasma generation cell includes a plasma generating structure configured to be selectively activated or deactivated. The plasma generating structure supplies plasma related fluxes to a region of the processing chamber responsive to being activated. The plasma generation cell further includes a set of electrical connectors coupled to the plasma generation structure. The set of electrical connectors extend to a position outside the processing chamber. The set of electrical connectors are configured to receive electrical signal that selectively activate or deactivate the plasma generating structure.

In an exemplary embodiment, a plasma generation assembly includes a support structure configured to be disposed within a processing chamber. The support structure may form a channel. The plasma generation cell includes a plasma generating structure configured to be selectively activated or deactivated. The plasma generating structure supplies plasma related fluxes to a region of the processing chamber responsive to being activated. The plasma generation cell further includes a set of electrical connectors coupled to the plasma generation structure. The set of electrical connectors extend to a position outside the processing chamber. The set of electrical connectors are configured to receive electrical signal that selectively activate or deactivate the plasma generating structure.

In an exemplary embodiment, a plasma generation assembly includes a plasma generation structure. The plasma generation structure includes a first dielectric planar structure. The plasma generation structure further includes a first conducting planar structure disposed on the first dielectric planar structure. The plasma generation structure further includes a second dielectric planar structure disposed on the first conducting planar structure. The plasma generation structure further includes a second conducting planar structure disposed on the second dielectric planar structure. The plasma generation structure further includes a third dielectric planar structure disposed on the second conducting planar structure. The first dielectric planar structure, the first conducting planar structure, the second dielectric planar structure, the second conducting planar structure, and the third dielectric planar structure may together form a distribution of recesses. The plasma generation assembly may further include a first set of electrical connectors coupled to the first plasma generating structure. The first set of electrical connectors may be configured to receive electrical signals that selectively activate or deactivate the first plasma generating structure. The plasma generating structure supplies plasma related fluxes to a first region of the processing chamber using the distribution of recesses responsive to being activated.

FIGS. 1A-D illustrate capability of a stackable plasma source to have different configurations of connecting and driving (discharge generation) of the plasma source while keeping the same physical configuration of discharge elements, according to some embodiments. This is achieved by making access to electric terminals of every element outside of the vacuum chamber, where one can easily connect them in any configuration and to use any driving system. Details explaining what provides this capability we be understood from FIGS. 2-8, describing overall structure of the source and actual plasma elements. In some embodiments, the plasma generating cells include a set of addressable plasma elements. In some embodiments, the array of plasma generating cells (e.g., identical plasma generating cells) can be individually addressed to an ON or OFF state. An ON state is associated with activation of plasma generation and an OFF state may be associated with deactivation of plasma generation. For example, the addressable plasma elements can use dielectric barrier discharge (DBD) technology, which allows independent operation of each individual cell 102 (e.g., mini-source), using selection capability (addressing) of a cell 102 (e.g., DBD cell). Alternatively, the addressable plasma elements can include individually addressable shutters. An advantage of dielectric barrier discharge is that a common voltage waveform from a single power supply can be applied (e.g., configured to supply) simultaneously to all cells 102, but discharges will occur only in previously selected (addressed) cells, which can have natural memory capability without requiring additional memory holding elements. The remaining cells 102 will be idle (no discharge). An alternating voltage ($\pm V_s$) at frequency f from a power supply (e.g., AC generator) can generate a series of identical discharge pulses of the **2*f*** frequency in those selected cells. A discharge pulse can occur after every change of polarity, and the total amount of plasma related particles (ions, electrons, radicals) generated in any cell is proportional to the number of pulses generated in that cell.

A combination of different durations can be used to generate exposure patterns with independent activation and deactivation of the cells 102. In some embodiments, exposure patterns include data having a set of exposure durations mapped to individual plasma elements. The plasma elements may be oriented in a grid with individual activation instructions stored in an exposure file (e.g., an image file). In some embodiments, an exposure pattern may include duration values in different formats (e.g. quantities of time, number of plasma pulses, etc.) that can be mapped to the cells 102 such that each cell 102 permits passage or generate plasma related fluxes for an associated exposure duration.

As shown in FIG. 1A, the cells 102 may be disposed in an organized structure (e.g., a grid, a shape, etc.). Each cell 102 may be given an address in two dimensional space (X, Y) or (Z, Y) (e.g., axis 104 and axis 106). The former uses 2 electrodes structure, so both electrodes are used for both addressing and sustaining. The latter uses 3 electrodes, where additional electrodes are used together with Y (scan) electrode only for addressing, and X and Y electrodes are used for sustaining discharge. Both addressing and sustaining schemes can be used to address the electrodes. For example, a cell may be assigned an address with an X address (e.g., address on axis 104) and a Y address 406 (e.g., address on axis 106). In some embodiments, an exposure pattern (also known as an exposure map) can include a large array $t_{ik}$, or $N_{ik}$, where N is the number of pulses, and (i, k) is a node of the array with ($x_i$, $y_k$) coordinate of the (i, k)'s where the address identified in the exposure image corresponds with an address of a cell of the set of plasma generating cells 102. For example, an address in the exposure pattern may contain data indicative of a time duration or exposure duration an associated addressable node (or cell) is to activate during a plasma process. Each cell may be individually controlled for independent activation and/or deactivation of the plasma cells.

Figure 1B:
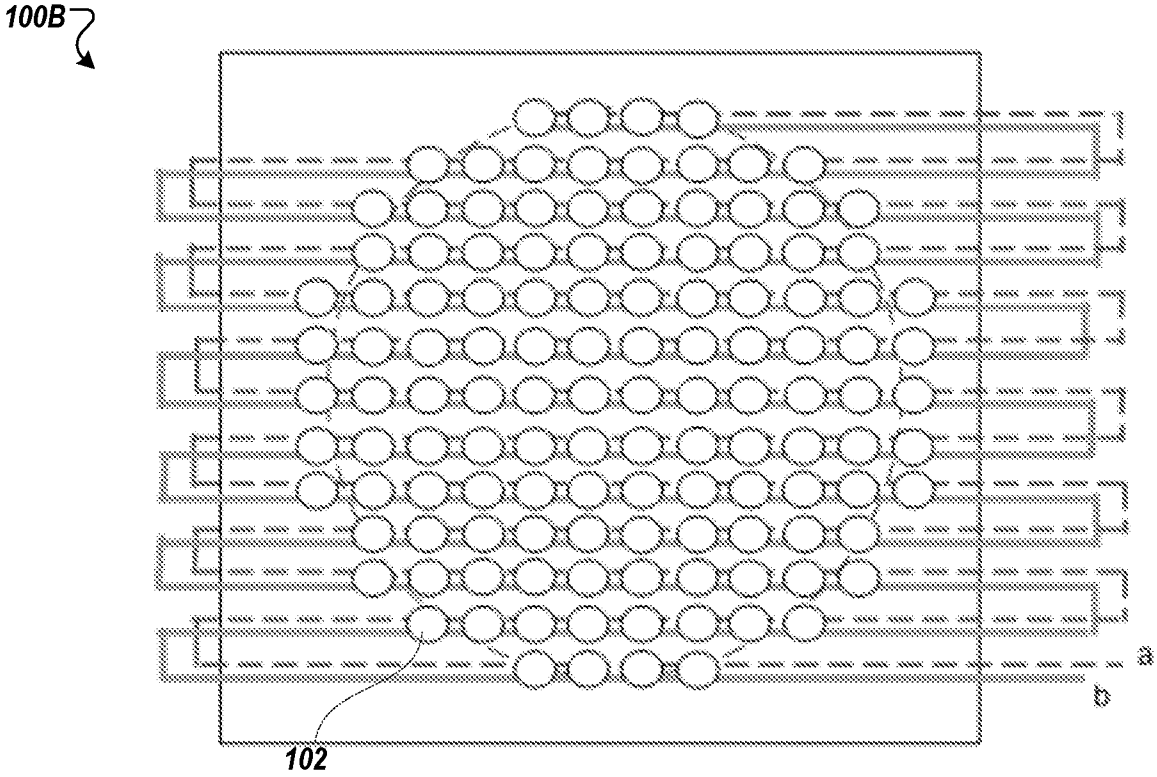

As shown in FIG. 1B, the cells 102 may be disposed in an organized structure (e.g., a grid, a shape, etc.). Each cell may be couple to a neighboring cell such that all the cells in the configuration 100B are controlled together. For example, when a first cell of the configuration 100B of plasma cells 102 is activated the entirety of the array of cells is also activated. The branching of the electric leads may be configured such that an A branch direct an electric signal a first direction through the plasma cells and a B branch directs the electric signal a second direction. As will be discussed later the electric lead my cause the plasma cells to activate and generate plasma such as for, example, plasma used for substrate processing.

Figure 1C:
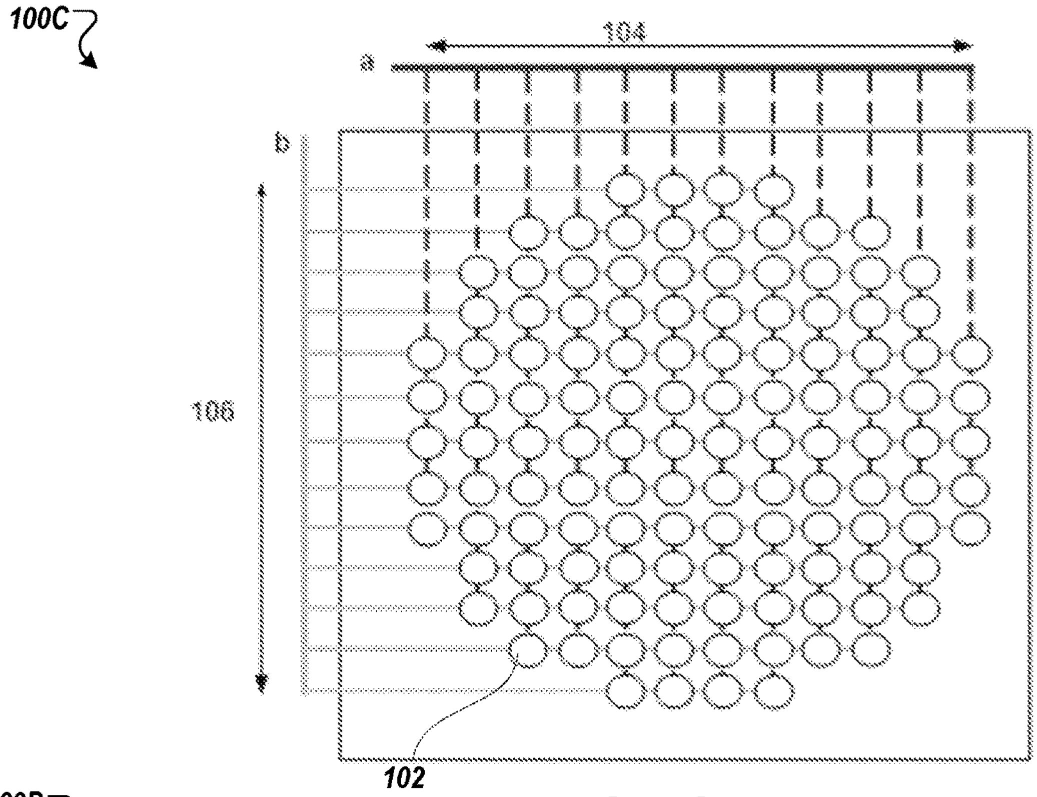

As shown in FIG. 1C, the cells 102 may be disposed in an organized structure (e.g., a grid, a shape, etc.). Each cell may include a first electric lead that corresponds to a first axis 104 and a second lead that corresponds to a second axis 106. In this configuration, each of the cells may be controlled together (e.g., activated/deactivated one with another). Each of the cells may be connected to other plasma cells in the same column using a first lead and other plasma cells in the same row with a second lead, as shown in FIG. 1C.

Figure 1D:
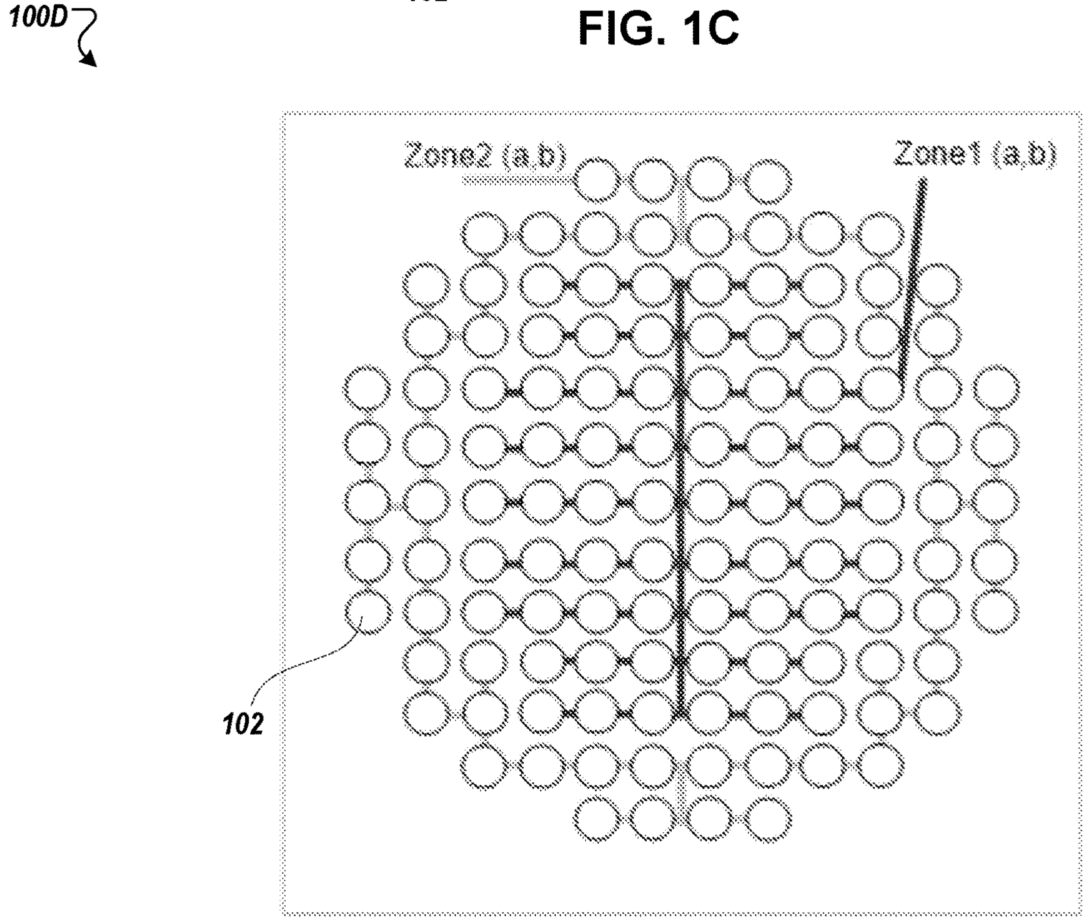

As shown in FIG. 1D, the cells 102 may be disposed in an organized structure (e.g., a grid, a shape, etc.). The cells may be divided into individual zones and wired such that plasma cells that are in the same zone are activated/deactivated together. For example, a first zone illustrated by the cells coupled to the darker "Zone 1 (a,b)" line are wired to be in the first zone and a second zone illustrate by the cells coupled to the lighter "Zone 2 (a,b)" are representative of the second zone. The zones may be divided into positions of the array such as a central zone and a boundary zone as shown in FIG. 1D.

In some embodiments, the cells wired as shown in FIG. 1A may be controlled like the configurations 100B-C illustrate in FIG. 1B-D by selective addressing and activation/deactivation of the individual cells.

Figure 2:
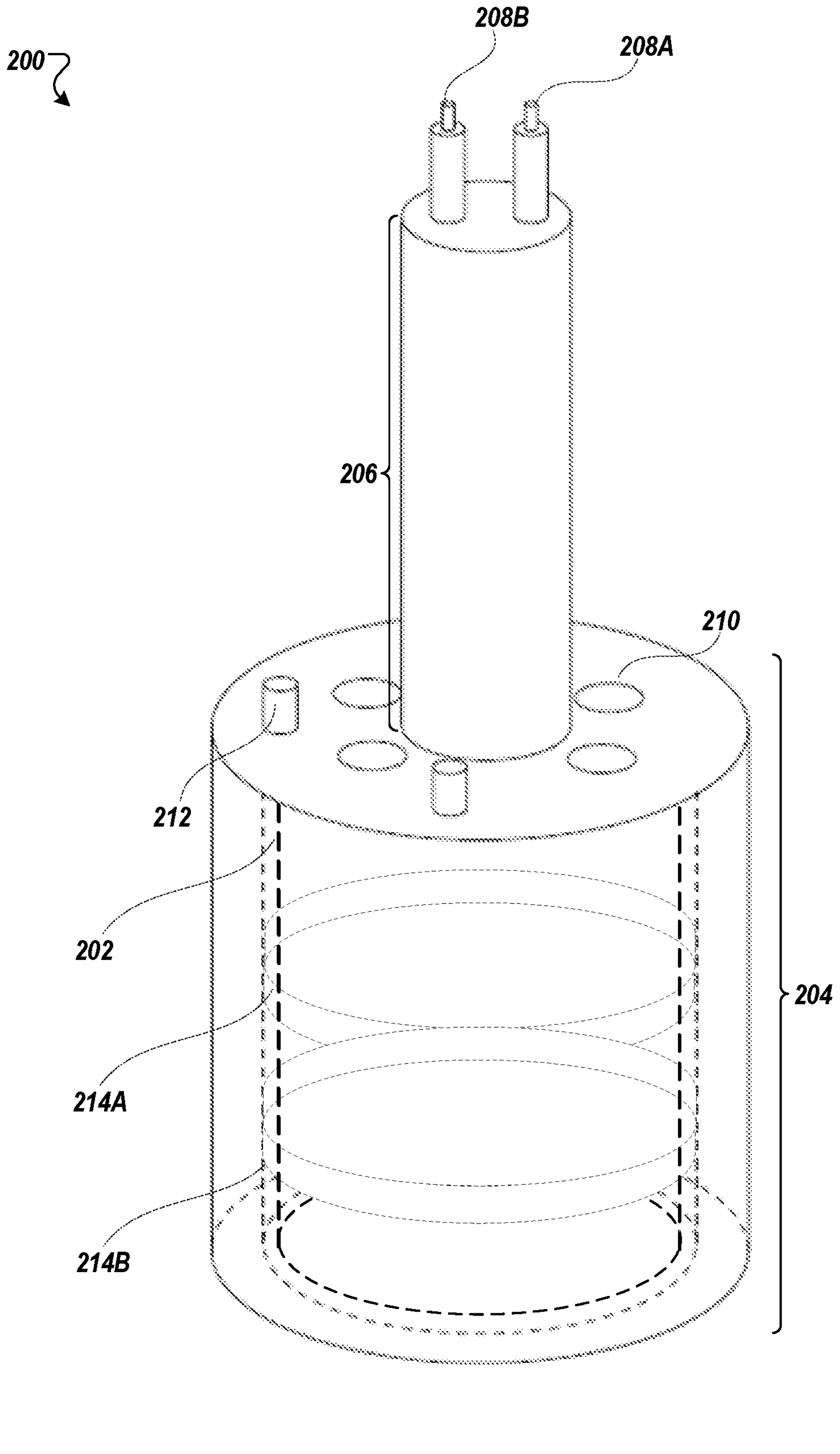
FIG. 2 illustrates a plasma generating cell of a plasma source, according to certain embodiments.

FIG. 2 illustrates a plasma generating cell 200 of a plasma source, according to certain embodiments. The plasma generating cell 200 includes a stem structure 206. The stem structure may include a longitudinal body that may be configured to couple with a support structure (e.g., a panel or carcass) housing a set of plasma generating cells 200. As will be discussed in other embodiments, the plasma generating cell 200 may selectively couple (e.g., friction fit, quick release coupling such as a clamp, and the like) to a support panel (e.g., a carcass for positioning an arrangement (e.g., a distribution such as an array) of plasma generating cells 200. The stem 206 may be selectively inserted to a recess or interior volume of the support panel and support (e.g., maintain a position and/or orientation of the plasma generating cell 200 (e.g., when disposed within a processing chamber). The stem 206 may be composed off an insulating material (e.g., a dielectric such as ceramic). The stem may include two or more conducting electrical connectors 208A-B. The electrical connectors 208A-B may be routed through the stem and couple to one or more aspects of the plasma generation structure 204. The electrical connectors 208A-B may include a casing or more generally an insulating boundary (e.g., to protect electrical signal from noise, or add rigidity). The stem may be filled completely or partially with material inside to prevent a gas leak through the stem. A first end of the electrical connectors 208A-B couples to electrodes of the plasma generation structure 204 and a second end is positioned outside a processing chamber (e.g., in atmospheric environmental conditions).

Stem may be long enough to protrude from its place in the support structure to the atmosphere.

The plasma generation structure 204 includes elements, structures, and/or features capable of generating a plasma (e.g., supplying a plasma to a processing chamber). The plasma generation structure 204 may include an interior volume 202 formed by and interior surface of the plasma generation structure 204. Inside the walls surrounding volume 202 one may house one or more sets of electrodes 214A-B (e.g., of 2, 3, or more electrodes), so that electrodes 214A-B are insulated from the inner and outer surfaces of 204 For example, a first electrode 214A may be disposed inside a first area of the wall of the plasma generation structure 204 and a second electrode 214B may be disposed inside a second area of the wall of the plasma generation structure 204. A first electrode 214A may couple to a first electrical connector 208A and a second electrode 214B may couple to a second electrical connector 208B, and so on. Further distributions and/or configurations of one or more sets of electrodes 214A-B are discussed in other embodiments.

As shown in FIG. 2 the plasma generation structure 204 includes one or more gas injection sites 210 (e.g., gas injection holes) formed by the plasma generation structure 204 (e.g., at a junction of the stem and the plasma generation structure 204 as illustrated in FIG. 2). The plasma generation structure 204 may supply plasma processing gas (e.g., air, $O_2$, $N_2$, Ar, $NH_3$, He and/or other appropriate processing gases) into the interior volume 202 of the plasma generation structure 204 using the gas injection sites 210.

In some embodiments, the plasma generation structure 204 is composed of an insulating material such as a dielectric material (e.g., a ceramic material). As will be discussed in other embodiments, the electrode may be embedded into the dielectric material and/or disposed on a surface of the dielectric material and covered by another material.

In some embodiments, the plasma generating cell 200 includes an alignment structure 212 coupled to the support structure and/or the first plasma generation cell. The alignment structure 212 maintains a rotational position of the first plasma generation cell within the first channel. For example, the alignment structure 212 may include an alignment that is coupled (e.g., integrated, adhered to, brazed together, and the like) to one or more of a support panel (e.g., that couples to the plasma generation cell) or the plasma generating cell 200. The alignment structure 212 may be selectively removable (friction fit, quick release coupling, and the like) from the other of the one or more of a support panel (e.g., that couples to the plasma generation cell) or the plasma generating cell 200.

Figure 3:
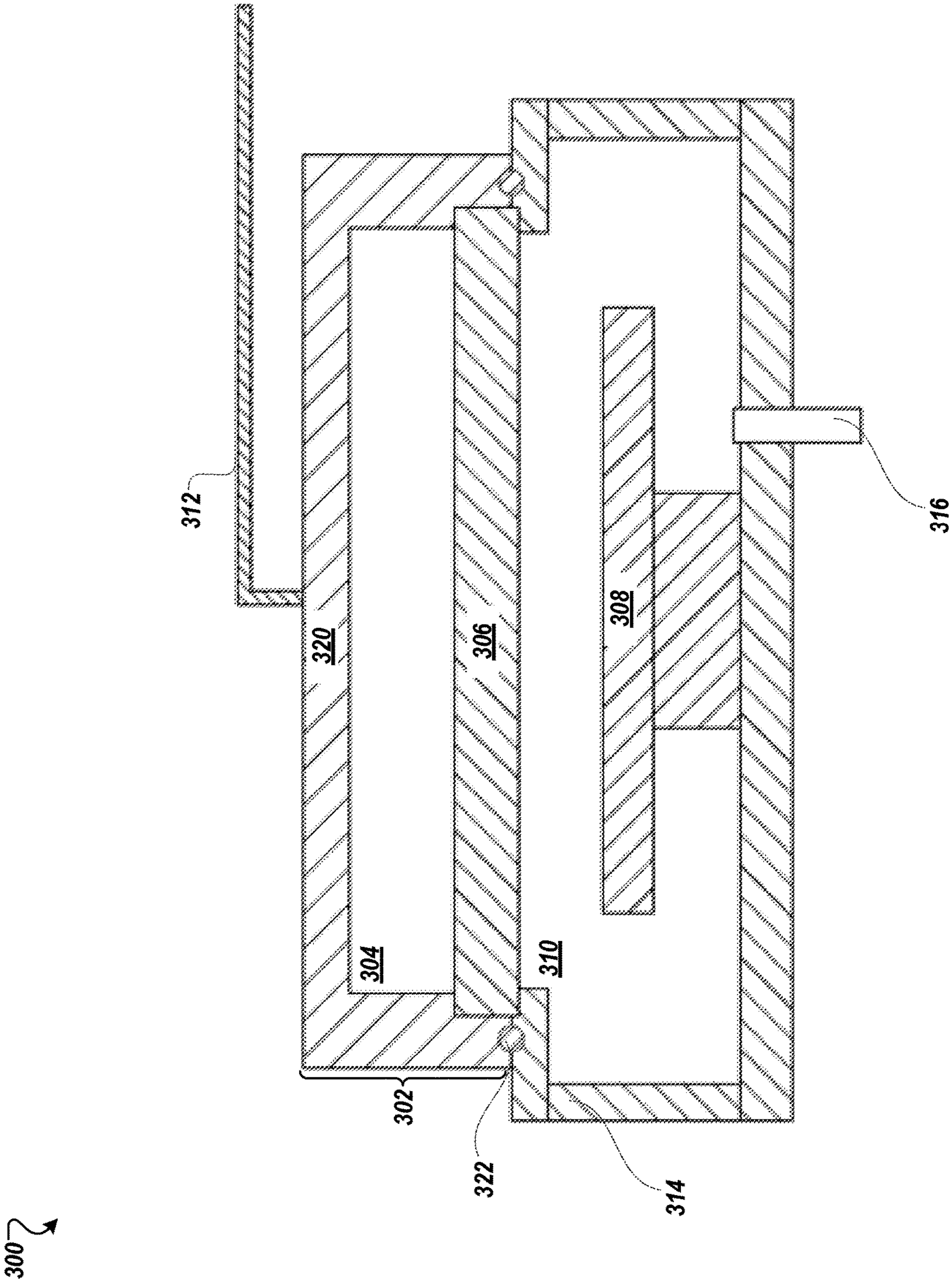
FIG. 3 illustrates a plasma processing system including a plasma generation assembly and a chamber body housing a plasma source, according to certain embodiments.

FIG. 3 illustrates a plasma processing system 300 including a plasma generation assembly 302 and a chamber body 314 housing a plasma source, according to certain embodiments. The processing system 300 may include a processing chamber 310 and a plasma source 302. A plasma source 302 includes walls 320 (e.g., to hold maintain a vacuum and or a gas delivery volume 304), a gas inlet 312, the gas delivery volume 304 limited by the walls 320 and a plasma generation assembly 306. Processing chamber 310 includes chamber body 314 that holds inside vacuum and provides support to the plasma source 302, substrate support structure 308, and gas outlet 316. The gas inlet 312, plasma generation assembly 306 and gas outlet 316 may provide a flow of feed gas through the processing system under processing gas pressure. The feed gas may comprise any of air, $O_2$, $N_2$, Ar, $NH_3$, He and/or other appropriate processing gases. Plasma source 302 may include a gas expansion volume of a gas injector (e.g. without plasma). The plasma source 302 may be designed to deliver plasma (e.g., generating or facilitating flow into) to a processing chamber 310. The plasma source delivers plasma through plasma generation assembly 306. The processing chamber 310 houses a substrate disposed on a substrate support structure 308 to be processed by the processing system 300. The processing system 300 may be a plasma chamber including an etch chamber, deposition chamber (including atomic layer deposition, chemical vapor deposition, physical vapor deposition). For example, the plasma chamber may be a chamber for a plasma etcher, a plasma cleaner, and so forth.

The plasma generation assembly 306 may include a holding structure (sometimes referred to as a support structure) and an arrangement of plasma generating cells (e.g., plasma generating cell 200 of FIG. 2) selectively coupled (e.g., easily removable from but maintains a position and/or orientation when coupled) to the holding structure. In some embodiments, the holding structure includes a frame or carcass for holding each of the plasma generating cells.

The plasma generation assembly 306 is positioned above a substrate positioned on the substrate support structure 308. The plasma source 302 forms an interior volume that functions as a gas delivery volume 304. Feed gas is received by the gas inlet 312 and is delivered to the various plasma generation cells of plasma generation assembly 306. For example, the feed gas enters the gas distribution volume 304, spreads above the plasma generation assembly 306 and enters the plasma cells. Plasma is generated in cells placed in the holding structure together forming the plasma generation assembly 306. Plasma is supplied to the processing chamber 310. In some aspects, plasma is prevented from flowing into the gas distribution volume 304.

Figure 4:
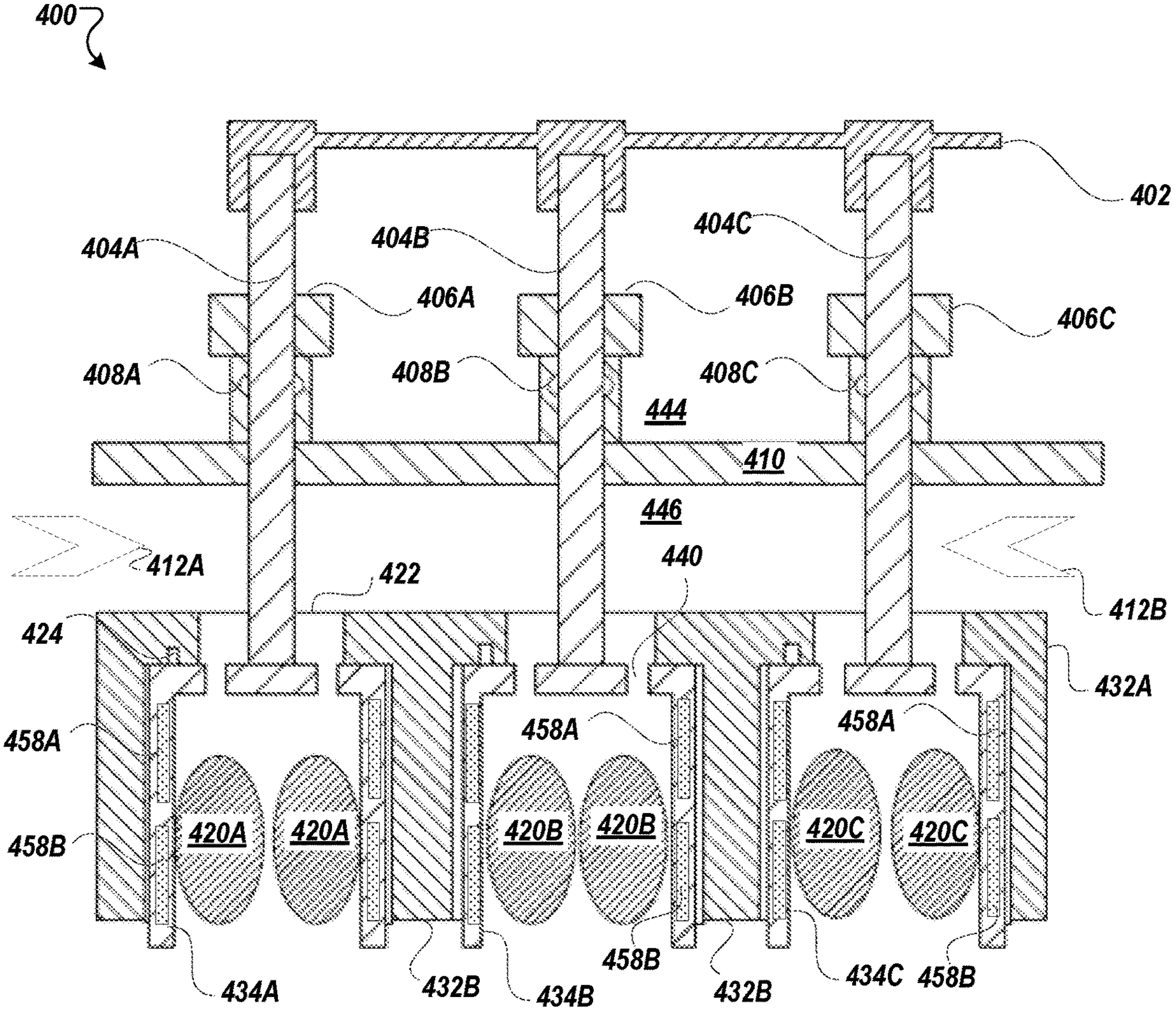
FIG. 4 illustrates a stackable plasma source, according to certain embodiments, that uses the plasma generating cell.

FIG. 4 illustrates a stackable plasma source 400, according to certain embodiments, that uses the plasma generating cell 200. The stackable plasma source 400 includes electric connections 402 that couple individually, collectively, or any division of the collective of plasma generating cells that include stems 404A-C (e.g., stems 206 of FIG. 2), plasma generating structures 434A-C (e.g., plasma generating structures 204 of FIG. 2). The electric connections 402 may be configured to receive electrical signals that activate and/or deactivate a corresponding plasma generating cell (e.g., a plasma generating structure 434A-C). Responsive to being activated, a plasma generating structure 434A-C may generate or otherwise supply plasma related fluxes 420A-C to a region below the corresponding plasma generating structure 434A-C (e.g., a plasma processing region of a processing chamber such as, for example, a region housing a substrate to be processed). The plasma generating structures 434A-C may be independently activated for a duration of time and/or independently deactivated for a similar or different duration of time such as, for example, to alter an exposure duration downstream processes (e.g., a substrate positioned below the stackable plasma source) experience plasma the related fluxes 420A-C. The activation and/or deactivation of the plasma related cells may be coordinated to effectuate a plasma process on a substrate disposed proximate the plasma generating structures 434A-C that meets target process conditions (e.g., process uniformity, target film thickness requirements, process result critical dimensions standards, and the like).

The stackable plasma source 400 includes a connection structure 410 (e.g., a cover structure, a sealing structure) and a holding structure 432A-B (e.g., support structure 306 of FIG. 3). The connection structure 410 (e.g., connection structure 320 of FIG. 3) may include one or more connection elements 406A-C that coupled to the stems 404A-C of the plasma generating cells. The one or more connection elements 406A-C may include an Ultra Torr connector or other devices capable of forming a seal (e.g., configured to form) between the stems 404A-C and the connection structure 410. The connection elements 406A-C may include a sealing elements 408A-C. The sealing elements may include one or more of an extruded and/or cut seal profile, an elastomer, a gasket, a flange seal, a radial seal, an axial face seal, a press-in-place, seal, a composite seal, and the like. The connection elements 406A-C form a seal with stems 404A-C such that a first environment 444 disposed on a first side of the connection structure 410 is sealed from a second environment 446 disposed on a second side of the connection structure 410. In some embodiments, the first environment 444 is an environment external to a processing chamber (e.g., an environment at atmospheric pressure). In some embodiments, the second environment 446 provides a feed gas flow 412A-B to the plasma generating structures 434A-C. For example, a process gas may flow through the second environment 446 to one or more channels 422 of the holding structure 432A-B and one or more gas injection sites 440.

In some embodiments, the connection structure 410 (e.g., connection structure 320 of FIG. 3) includes a metal material with a dielectric layer on the vacuum side (bottom). In some embodiments, the connection structure 410 is a cover structure (e.g., a top surface or top cover structure to a processing chamber).

The holding structure 432A-B may include a thick plate (e.g., as illustrated in plasma generation assembly 306 of FIG. 3) that forms holes 422 for stems 404A-C and a pockets for the plasma generating structures 434A-C (e.g., plasma generation structures 203 of FIG. 2) with walls 432B of these pockets. The holding structure 432A-B forms a distribution (e.g., an array) of pockets (e.g., along a plane corresponding to the planar portion 432A) to receive the plasma generating cells.

In some embodiments, the pockets may have polygon boundaries surrounding the plasma generating structures 434A-C such as circular structure, a hexagon (e.g., honeycombed shape distribution), and/or other shape arranged at least a portion of the plasma generating structure 434A-C. In some embodiments the walls are disposed proximate the plasma generating structures 434A-C such that the gap between them is minimized, however, in some embodiments, such as embodiments leveraging inverse-electrodes configurations walls 432B may form a passive parts of the plasma generating structures In some embodiments, each cell is pressed against the holding structure 432A-B and fixed in place by the connection structure 410 (e.g., a sealing structure). The connection structure 410 may include a connection element 406A-C (e.g., an UltraTorr© connector) and an O-ring 408 disposed between the stems 404A-C and the connection element 406A-C. Gas flows to each cell 412 from the gas distribution area (e.g., the second environment 446) through the channels 422 and the gas injection sites 440 (210). In some embodiments, a vacuum condition of the second environment 446 is maintained by the connection elements 406A-C (e.g., UltraTorr® connectors) of the connection structure 410 (e.g., metal cover panel). The second environment 446 and the holding structure 432 thermally isolate the connection elements 406A-C from the processing region below the plasma generating structures 434A-C.

In some embodiments, the holding structure 432A-B is a ceramic carcass for alignment of all cells and the connection structure (e.g., metal and/or cover). The holding structure 432A-B and the connection structure 410 are aligned so the channel or gaps formed by each allows for the stem to slide into place. The space between the connection structure 410 and the holding structure 432A-B serves as a gas distribution area.

In some embodiments, the plasma or radicals are maintained below the plasma generating structures 434A-C and are prevented from entering the space between the connection structure 410 and the holding structure 432A-B. In some embodiments, an O-ring combined with vacuum elements (e.g., Ultra Torr components) may be used by the connection structure 410 to form a seal with the stems 404A-C.

In some embodiments, the connections arrangement of electric connections 402 may be easily modified. For example, each of the electric connections may operate in parallel, arranged in zones, chained in lines to make a two-dimensional (2D) array for controlling individual plasma cells.

In some embodiments, each of the cell can be tested independently prior to assembly. The manufacturing of individual plasma cells may provide simpler manufacturing procedures that may be tested along the way rather than an entire panel of cells being manufactured only for a defect to be later found.

In some embodiments, the holding structure 432A-B forms a loose contact with the plasma generating structures 434A-C. For example, the holding structure 432A-C may provide a shell for the plasma generating structures 434A-C without physical coupling of the two devices. The holding structure 432A-C may provide positioning of the plasma generating structure 434A-C, however, the plasma generating structure 434A-C may ultimately be held within the recesses of the holding structure 432A-C by the connection structure 410. The holding structure 410 and the plasma cells may have loose arrangement such as, for example, to not create mechanical stresses to each other under the various process conditions that may occur (e.g., when processing a substrate within a processing chamber beneath the plasma generating structures 434A-C).

In some embodiments, the plasma generating structures 434A-C may have similar geometries that can be designed for different discharge power (e.g., rate of supplying plasma flux). For example, the plasma generating structures 434A-C may be designed with different widths of buried discharge electrodes 458A-B, or different internal diameters of the recess formed by the plasma generating structures 434A-C (e.g., within a dielectric material such as a glazed on the conducting electrodes 458A-B). In some embodiments, a process profile may be processed using a variety of exposure duration for specific plasma generation cells and/or using a variety of plasma cell dimensions and equipment. For example, the same signal may be provided to each of the cells but each cell may provide a different plasma power to a region of a processing chamber. System arrangements of specific dimensions of the plasma cells may be leveraged to carry out a plasma process procedure.

Figure 5A:
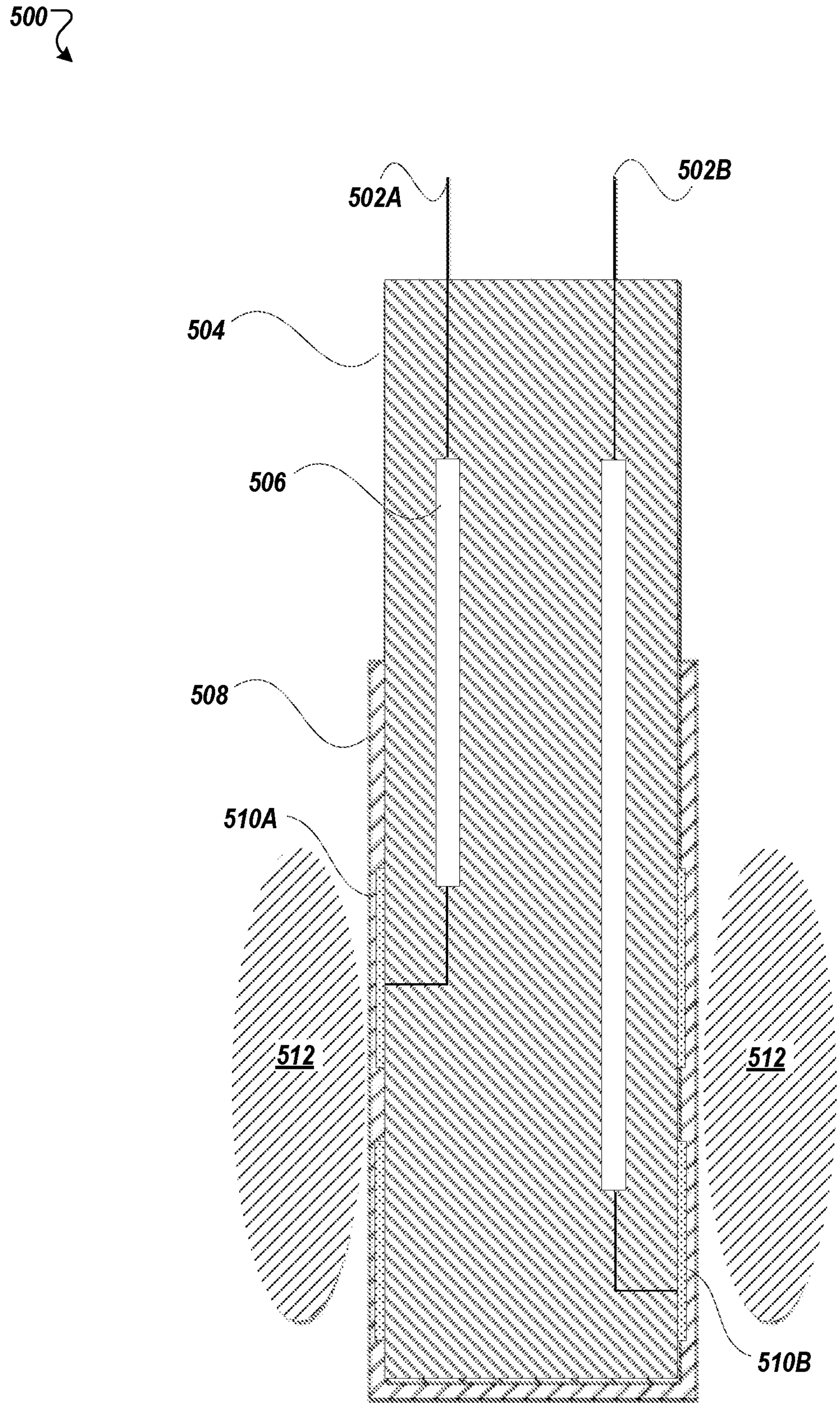
FIG. 5A illustrates a plasma generating element of a stackable plasma source, according to certain embodiments.

FIG. 5A illustrates a plasma generating element 500 of a stackable plasma source, according to certain embodiments. The plasma generating cell includes a first base structure 504 with integrated stem to which one or more other components are integrated, connected, or otherwise coupled to the base structure 504. The base structure 504 may include a rod structure, a one end closed tube structure (e.g., a hollow cylinder, hollow shape with a seal on the bottom end), or other shaped structure to couple together the identified parts of plasma generating cell 500. The base structure 504 may include an insulating material such as a dielectric (e.g., a ceramic material).

As shown in FIG. 5A, the plasma generating element 500 may include two or more electrodes 510A-B and portions of the base structure 504 with electrodes 510A-B may be covered by a dielectric layer 508.

In some embodiments, the plasma generating cell 500 forms one or more recesses proximate the electrical leads 502A-B to provide electrical isolation (e.g., a gap) between the electrical leads and portions of the base structure 504 proximate the electrodes 510A-B.

As shown in FIG. 5A, the plasma generating element 500 includes electrical leads 502A-B each coupled to appropriate electrode 510A-B. The electrical leads provide an activation and/or deactivation signal to the electrodes 510A-B. The electrodes may interact with a process gas supplied around the outer surface of the plasma generating element 500 to generate or otherwise supply plasma related fluxes 514 to a region proximate the plasma generating cell 500. The leads may be configured to receive the electrical signal in an environment outside a processing chamber (e.g., atmospheric conditions).

As shown in FIG. 5A, the base structure 504 is coupled to a pair of electrodes 510A-B, and a dielectric material disposed between the pair of electrodes 510A-B as well as above and below the pair of electrodes 510A-B. In some embodiments (e.g., such as process dependent embodiments such as when process condition correspond to pressures about threshold pressures), more than a single pair of electrodes may be used (e.g., disposed on the outer surface of the base structure). These pairs of electrodes may be connected to work in parallel such that, for example, the electrodes activate and deactivate in connection with one another. Electrodes may be covered by a dielectric layer 508.

Electrodes 510A-B may be identified by a terminal such as an A terminal and a B terminal. Electrodes 510A-B identified as an A terminal may represent electrical leads associated with first voltage and B terminals are associated with a second voltage. In some embodiments, the order of electrode terminals may include ABBA or ABAB for two pairs, ABABAB for three pairs, and so forth for any given number of electrode pairs. The order for electrode connection to terminals A and B can be made outside the element (e.g., by controlling the signal delivered to the plasma cell), which can promote hardware configuration flexibility.

Figure 5B:
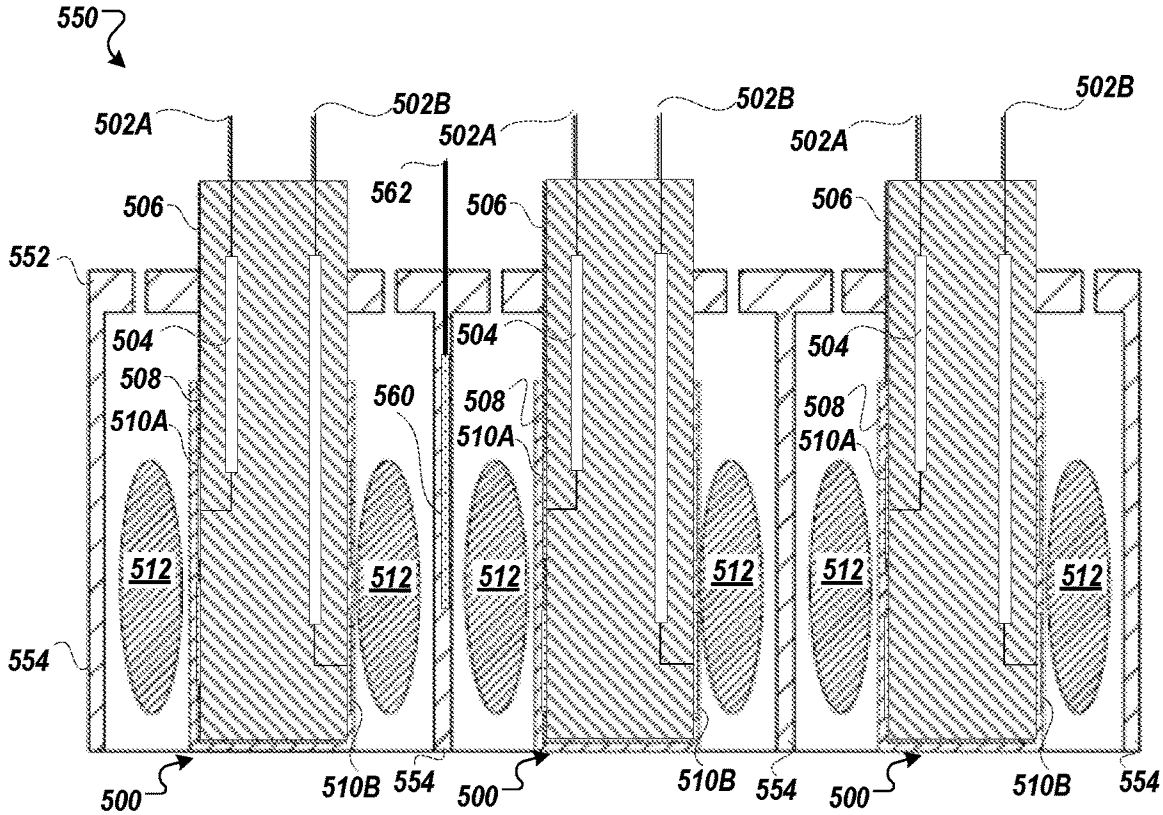
FIG. 5B illustrates a plasma generation assembly, according to certain embodiments.

FIG. 5B illustrates a plasma generation assembly 550, according to certain embodiments. (The top cover, gas distribution area, vacuum seal, etc. are not shown). The plasma generation assembly 550 may include an arrangement of plasma generating elements 500 and surrounding each element walls that belong to a holding structure 554 in an arrangement outlined by a holding structure 552 (e.g., a ceramic carcass). The holding structure may include one or more feature of holding structure 432A-B of FIG. 4. The plasma generating elements 500 may include one or more features of plasma generating elements 500 of FIG. 5A (e.g., base structure 506, electrodes 510A-B, electrical leads 502A-B, dielectric layer 508, plasma related fluxes 512, and the like. The plasma generating elements 500 may be disposed in an arrangement of cells (e.g., an array).

As shown in FIG. 5B, the holding structure 552 may include one or more walls 554 or boundary structures that extend around individual plasma generating elements 500 and define the size of each plasma generating cell. The walls may surround an outer surface of the plasma generation elements 500 such as, for example, in a circular, honeycomb, or other shape capable of enclosing a portion of the plasma generation cells. In some embodiments, the walls may act to reduce interference of plasma related fluxes corresponding to different individual plasma generating cells 500. For example, in some cases (e.g., certain process conditions, certain process procedures, etc.) interference of the plasma related fluxes may result in "dark" areas (e.g., areas where the plasma interferes with itself create adverse process results) that often result in process results deviating from a target process result condition. Reduction of the effect of the "dark" areas may allow for plasma assembly setups where the plasma source may be position closer to the substrate to be processed without experiencing undesired effects of the process result.

In some embodiments, an auxiliary electrode may be buried into the walls 554 of the substrate. The auxiliary electrodes may be disposed generally or approximately perpendicular to the main electrodes 510A and 510B. Electrical leads associated with auxiliary electrodes may be connected in rows and buried inside the carcass structure 552.

Figure 5C:
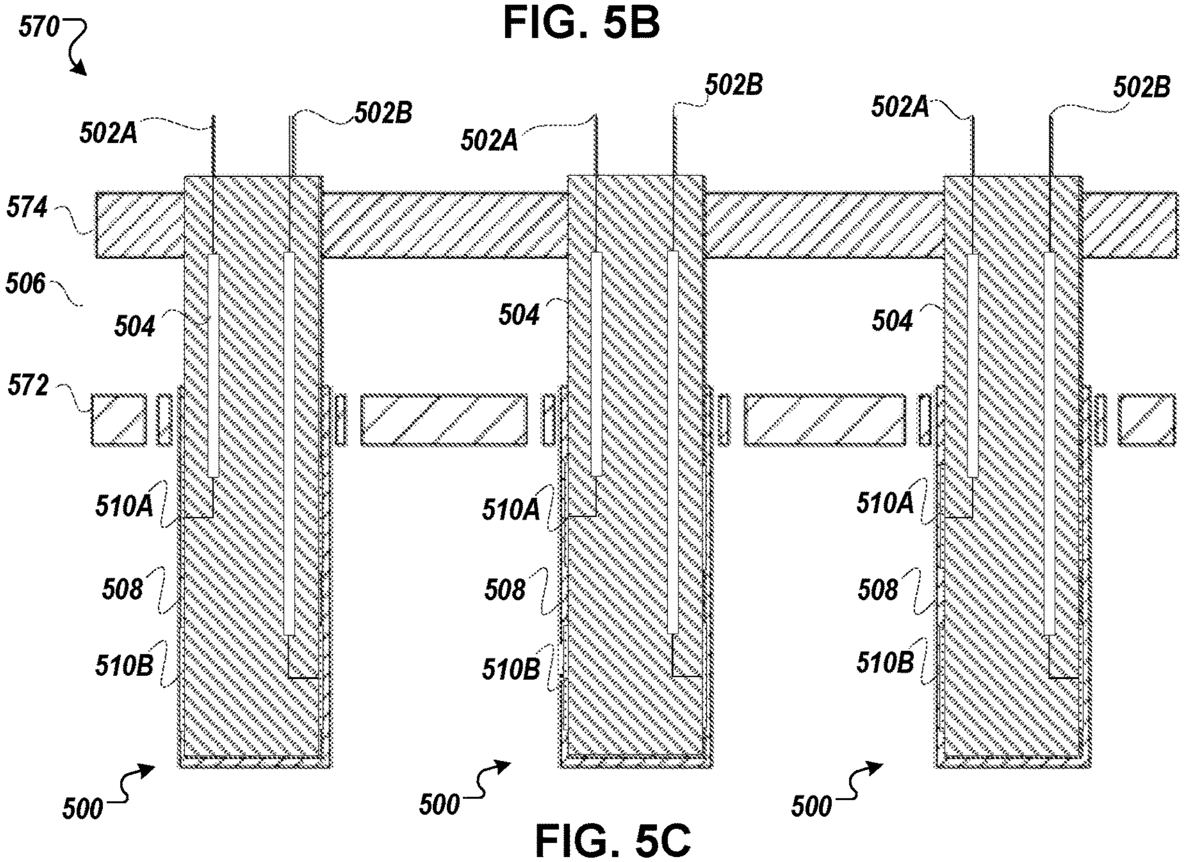
FIG. 5C illustrates a plasma generation assembly, according to certain embodiments.

FIG. 5C illustrates a plasma generation assembly 570, according to certain embodiments (outside connection and vacuum seal are not shown). The plasma generation assembly 570 may include an arrangement of plasma generating cells 500 in an arrangement outlined by a holding structure 572 (e.g., a ceramic carcass). The holding structure may include one or more feature of holding structure 432A-B of FIG. 4. The plasma generating cells 500 may include one or more features of plasma generating cells 500 of FIG. 5A (e.g., base structure 506 (e.g., stem), electrodes 510A-B, electrical leads 502A-B, dielectric layer 508, plasma generation areas 512, and the like. The plasma generating cells 500 may be disposed in an arrangement of cells (e.g., an array).

As shown in FIG. 5C, the plasma generation assembly 570 includes a connection structure 574 and a holding structure 572. The connection structure 574 may include one or more details and/or features of connections structure 410 of FIG. 4. For example, the connection structure 574 may secure a position (e.g., hold in place) the plasma generating cells 500 and/or provide a seal with each of the base structure 506 of the plasma generation cells 500.

As shown in FIG. 5C, the plasma generation assembly 570 includes a holding structure 572 (e.g., a ceramic carcass). The holding structure 572 includes a distribution of recesses or channels that receive the plasma generating cells 500. The holding structure 572 may include one or more features of holding structure 424A-B of FIG. 4. Holding structure 572 does not have any sidewalls between the individual plasma generation cells 500. Plasma generation assembly 570 may include a larger processing target area (e.g., or "process spot") under each elements, allowing overlapping between plasma generated species, and a smoother process pattern may be obtain on a substrate that with embodiments having walls disposed between the plasma generation cells 500.

Figure 6A:
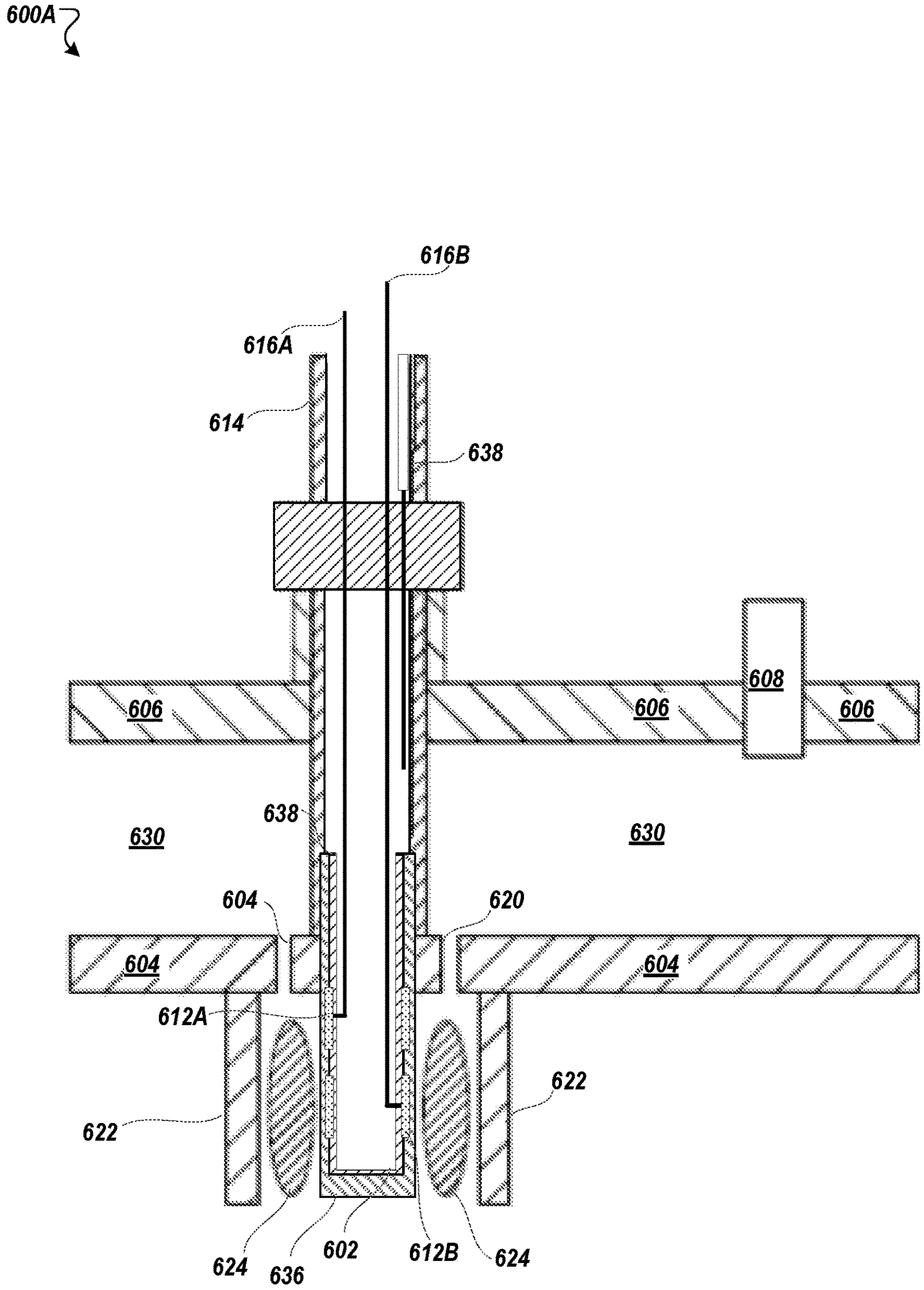
FIG. 6A illustrates a stackable plasma source, according to certain embodiments.

FIG. 6A illustrates a stackable plasma source 600A, according to certain embodiments. The stackable plasma source 600A may include elements discussed in association with other figures such as plasma source 400 of FIG. 4. For example, the stackable plasma source 600A may include a connection structure 606 (e.g., a cover structure, a metal plate, a top of a processing chamber, etc.) and a holding structure 604 (e.g., a shell structure, a carcass, a ceramic panel, etc.). The connection structure 602 and the holding structure 604 may form a region 630 that directs process gas flow to plasma generation cells. The process gas may be directed into region 630 using gas ingress structure 608.

The stackable plasma source 600A includes plasma generation cells (only one illustrated in FIG. 6A) coupled to the connection structure 606 and the holding structure 604. The plasma generation cells include a base structure 602 with a set of electrodes (electrode 612A and electrodes 612B). The holding structure 604 includes walls 622 disposed between plasma generation cells (only one plasma generation cell is illustrated, but similar to other embodiments, an arrangement (e.g., an array) of plasma generation cells bay be incorporated in the stackable plasma source 600A. The plasma generation cells are designed to generate plasma 624 and plasma related fluxes.

As shown in FIG. 6A the plasma cell may include one or more sets of electrical connectors 616A-B that are stored within a stem structure 614. The stem structure 614 may extend through connection element 610. Connection element may include one or more feature and/or details of connection elements 406A-C, discussed previously.

In some embodiments, the stem structure may include a tube designed to couple to the base structure 602. A dielectric layer 636 may be disposed on the tube covering electrodes 612A-B.

In some embodiments, the base structure 602 is inserted (e.g., and sealed) in the stem structure 614. The stem structure 614 may block a gas flow leak through the connection structure 606. The stem structure 614 provides a conduit for the electrodes to receive signal from outside a processing chamber (e.g., in atmospheric conditions). The inside part of the stem structure may be open to atmosphere and can provide air cooling inside the stem structure. In some embodiments, the stem structure may house a cooling rod disposed in the opening that may facilitate cooling of the inside of the stem and the base structure 602.

Figure 6B:
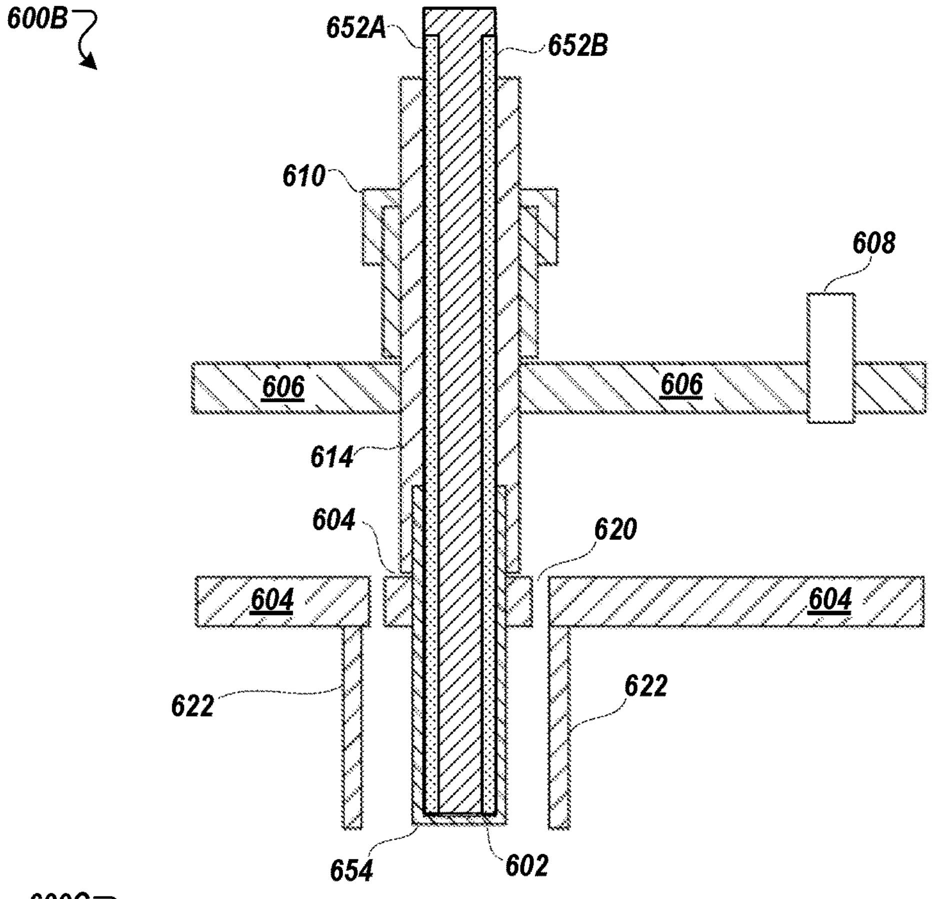
FIG. 6B illustrates a plasma generating cell of a stackable plasma source, according to certain embodiments.

FIG. 6B illustrates a plasma generating cell of a stackable plasma source 600B, according to certain embodiments.

The stackable plasma source 600A may include elements discussed in association with other figures such as plasma source 600A of FIG. 6A. For example, the stackable plasma source 600A may include a connection structure 606 (e.g., a cover structure, a metal plate, a top of a processing chamber, etc.) and a holding structure 604 (e.g., a shell structure, a carcass, a ceramic panel, etc.). The connection structure 602 and the holding structure 604 may form a region 630 that directs process gas flow to plasma generation cells. The process gas may be directed into region 630 using gas ingress structure 608.

The stackable plasma source 600A includes plasma generation cells (only one illustrated in FIG. 6A) coupled to the connection structure 606 and the holding structure 604. The plasma generation cells include a base structure 602 with a set of electrodes. The holding structure 604 includes walls 622 disposed between plasma generation cells (only one plasma generation cell is illustrated, but similar to other embodiments, an arrangement (e.g., an array) of plasma generation cells bay be incorporated in the stackable plasma source 600A. The plasma generation cells are designed to receive process gas through channels 620 of the holding structure 604 from region 630 and generate plasma related fluxes 624.

As shown in FIG. 6B the base structure may include electrodes 652A-B that extend along an outer surface of the base structure 602. In some embodiments, the electrodes are deposited onto the surface of the base structure 602. A bottom portion of the base structure 602 may further be covered with a thin dielectric layer 654. For example, electrodes 652A-B may be sufficiency covered as to not be exposed at any point below the holding structure 604 (e.g., the electrodes 652A-B are not exposed to vacuum conditions of a processing chamber). The base structure 602 may be inserted into a stem structure 614. In some embodiments, the joint between the base structure 602 and the stem structure 614 form a seal.

As shown in FIG. 6B, the electrodes are disposed vertically and extend towards the top (e.g., atmospheric environment where they may be connected to electrical connectors to receive activation/deactivation signals. In some embodiments, the electrodes cover most of a surface area of the base structure 602. As is discussed in other embodiments, more than a single pair of electrodes may be used. For example, two sets of electrodes, three sets of electrodes, and so forth may be used. The multiple sets of electrodes may be connected in parallel such as, for example, to coordinate activation and deactivation of the neighboring electrodes. The holding structure 604 may have an auxiliary horizontal electrode (e.g. electrode formed into a loop) buried inside walls 622 connected to other auxiliary electrodes in the top of the holding structure 604. Auxiliary electrodes may be connected to one another in rows.

Figure 6C:
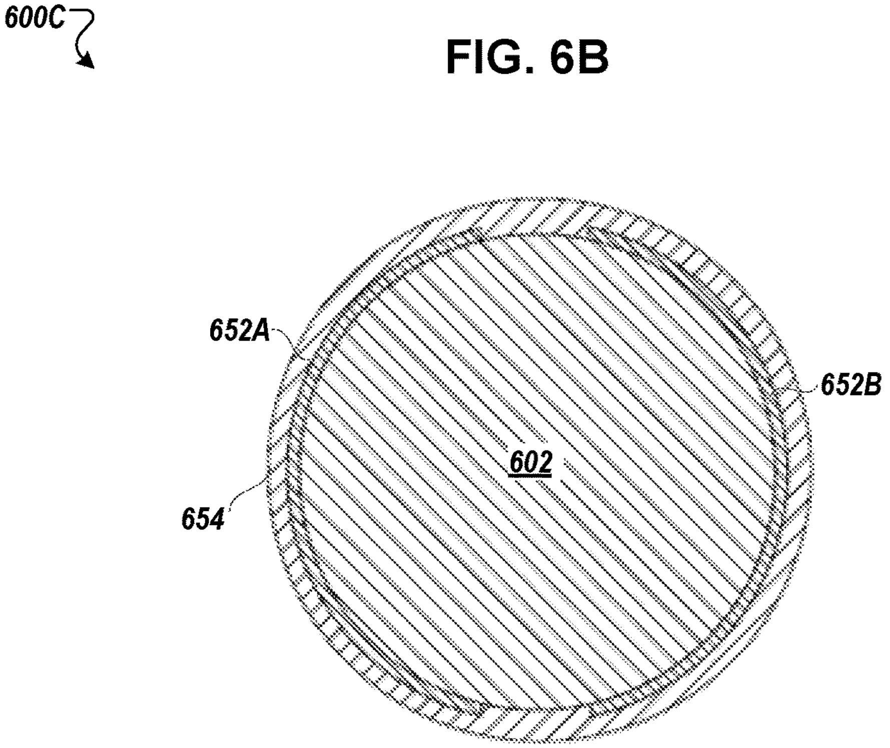
FIG. 6C illustrates cross section view of a plasma generating cell of a stackable plasma source, according to certain embodiments.

FIG. 6C illustrates cross section view of a plasma generating cell 600C of a stackable plasma source 600B, according to certain embodiments. As discussed previously, the base structure 602 may be bounded in part (e.g., a first portion of the base structure 652) by a first electrode 652A and bounded in part (e.g., a second portion of the base structure 602) by a second electrode 652B. In some embodiments, the electrodes may extend around an azimuthal direction of the base structure 602 and in other embodiments, the electrodes may extend along a later direction (e.g., as seen in FIG. 6C). As shown in FIG. 6C, the electrodes and base structure may be covered by a cover layer 654 that may include a dielectric material.

Figure 7A:
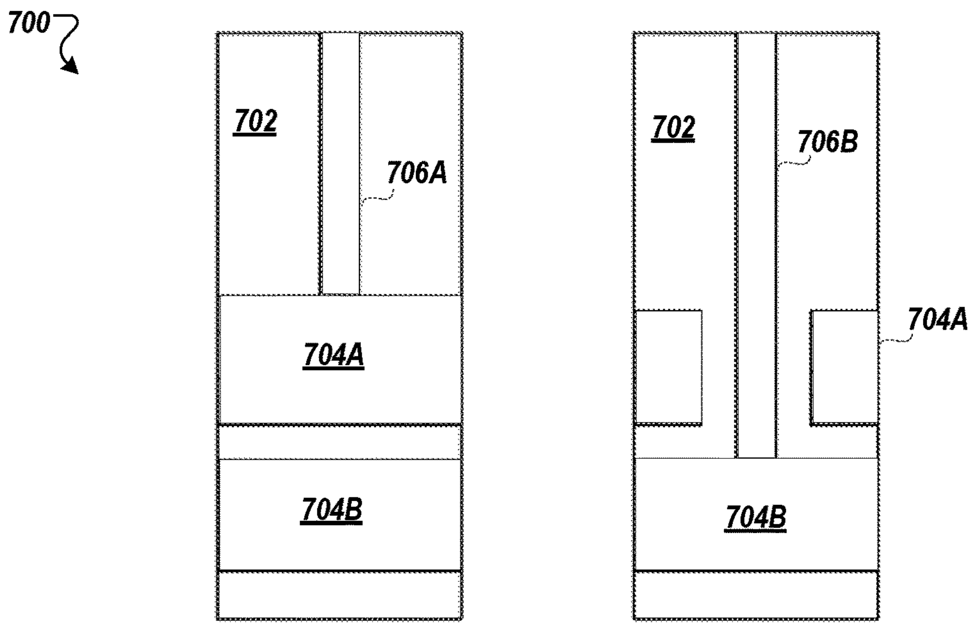
FIG. 7A-B illustrate electrode configurations of plasma generating cells, according to certain embodiments.
Figure 7B:
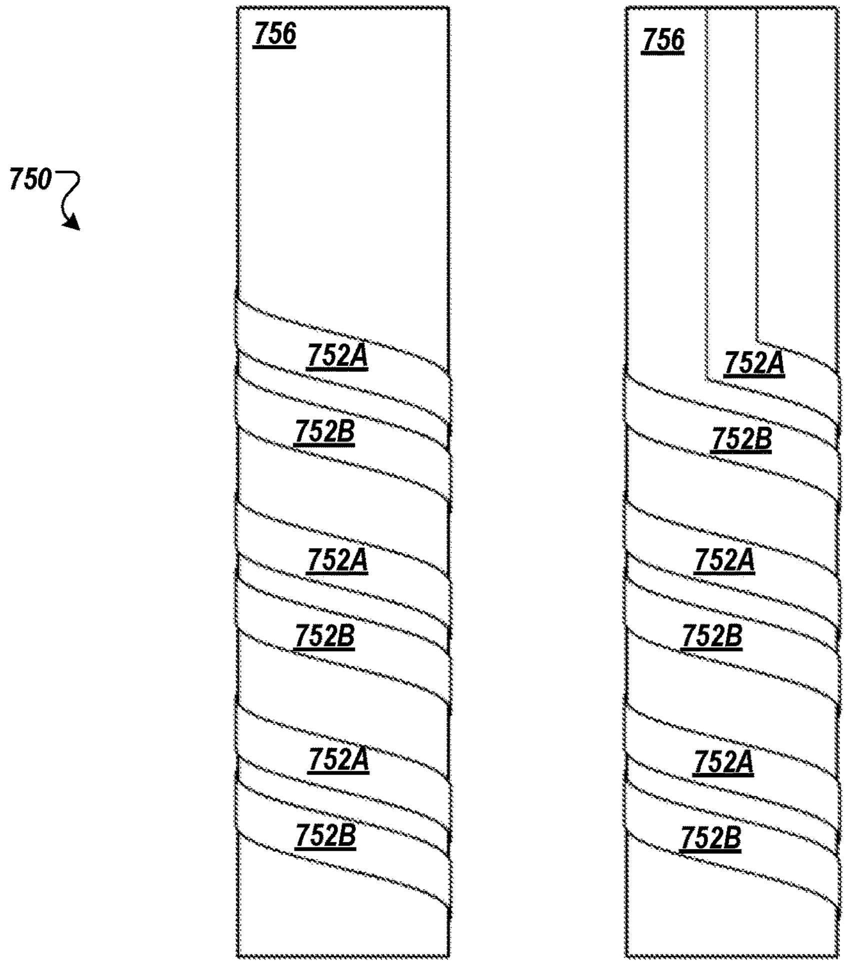

FIG. 7A-B illustrates electrode configurations of plasma generating cells 700A-B, according to certain embodiments. As discussed previously, the base structure 602 may be bounded in part (e.g., a first portion of the base structure 652) by a first electrode 652A and bounded in part (e.g., a second portion of the base structure 602) by a second electrode 652B. In some embodiments, the electrodes may extend around an azimuthal direction of the base structure 602 and in other embodiments, the electrodes may extend along a later direction (e.g., as seen in FIG. 6C). As shown in FIG. 6C, the electrodes and base structure may be covered by a cover layer 654 that may include a dielectric material.

In some embodiments, as shown in FIG. 7A a first electrical lead 706A may be coupled to a first electrode 704A that wraps around an outer perimeter of the base structure 702. A second electrical lead 706B may be coupled to a second electrode 704B that wraps around an outer perimeter of the base structure 702. The two perimeters may be displaced a distance with a dielectric material between them. As shown in FIG. 7A an electrode 704A may wrap entirely around the base structure but form a gap so the lead 706B of another electrode may extend and receive activation/deactivation signals. Electrodes 704A and 704B may include one or more features and/or details of other electrodes described herein.

In some embodiments, as shown in FIG. 7B, electrodes 752A-B may be disposed along an outer surface of the base structure 756. The electrodes may extend around the base structure while advance along a longitudinal direction of the base structure 756. For example, the electrode may be disposed in a helical structure (e.g., helical shape), as shown in FIG. 7B.

Figure 8:
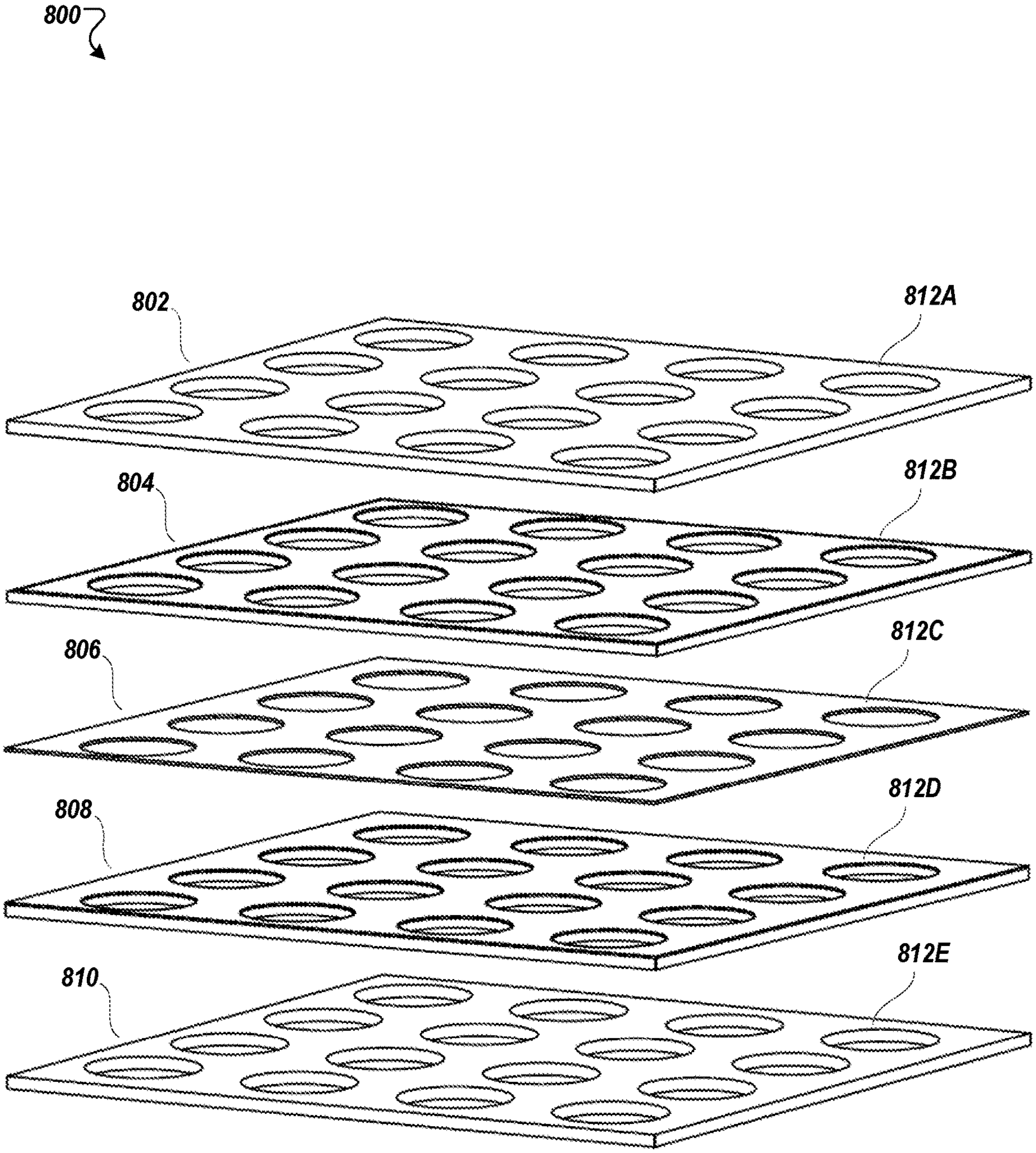
FIG. 8 illustrates a plasma generation assembly of a stackable plasma source, according to certain embodiments.

FIG. 8 illustrates a plasma generation assembly 800 of a stackable plasma source, according to certain embodiments. The plasma generation assembly 800 includes a plasma generation structure having multiple layers stacked on top of one another. For example, the plasma generation structure may include a first dielectric planar structure 810. The plasma generation structure may further include a first conducting planar structure 808 disposed on the first dielectric planar structure 810. The plasma generation structure may further include a second dielectric planar structure 806 disposed on the first conducting planar structure 808. The plasma generation structure further includes a second conducting planar structure 804 disposed on the second dielectric planar structure 808. The plasma generation structure further includes a third dielectric planar structure 802 disposed on the second conducting planar structure 804. The first dielectric planar structure, the first conducting planar structure, the second dielectric planar structure, the second conducting planar structure, and the third dielectric planar structure may together form a distribution of recesses 812A-E. There is a dielectric layer inside recesses 812D and 812C, which prevent direct contact between electrodes and plasma. The plasma generation assembly may further include a first set of electrical connectors (not shown) coupled to the first plasma generating structure. The first set of electrical connectors may be configured to receive electrical signals that selectively activate or deactivate the first plasma generating structure. The plasma generating structure supplies plasma related fluxes to a first region of the processing chamber using the distribution of recesses responsive to being activated.

The plasma generation assembly 800 may include one or more features and/or details of individual plasma cell described herein, however, plasma generation assembly may act a set of plasma cells connected in parallel. There may not be control within individual elements of the zone (e.g., individual plasma generating recesses) however, many of the plasma generation assembly 800 may be distributed along a service of a holding structure to provide processing control between individual plasma generation assemblies 800.

In some embodiments, each electrode in each zone may simply be parts of two identical metal plates separated and covered outside by dielectric plates. Both metal plates (and particularly holes) may be covered with a thin dielectric layer separately or together when stacked up as a zone, as shown in FIG. 8.

In some embodiments, a plasma generation assembly may include a second plasma generations structure includes additional layers of dielectric planar structure and/or conducting planar structure (e.g., a first, second, third, fourth, fifth, sixth, and so forth dielectric planar structure and/or conducting planar structure).

Figure 9:
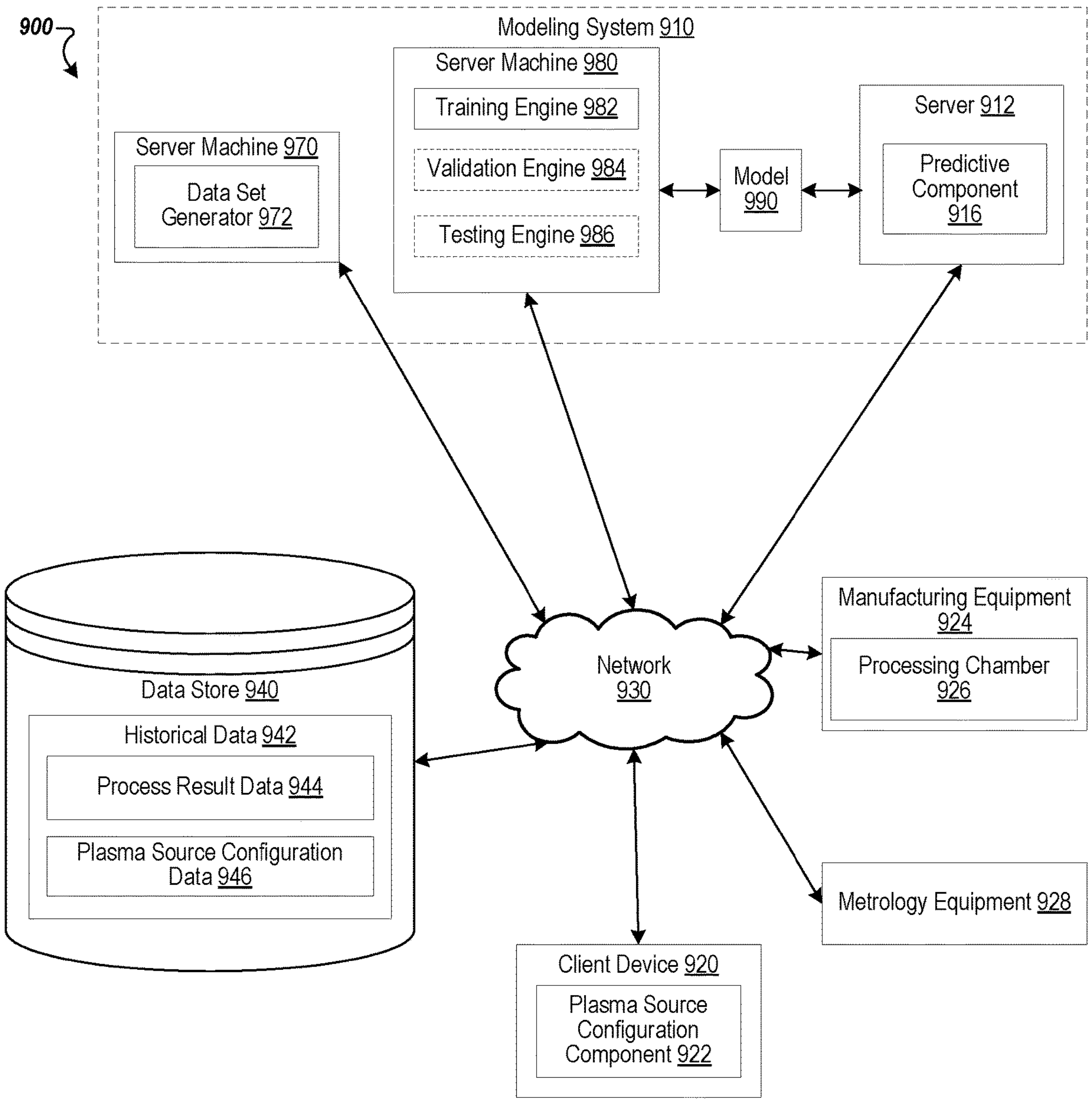
FIG. 9 is a block diagram illustrating an exemplary system architecture in which implementations of the disclosure may operate.

FIG. 9 is a block diagram illustrating an exemplary system architecture 900 in which implementations of the disclosure may operate. System architecture 900 includes a client device 920, manufacturing equipment 924, metrology equipment 928, a server 912, and a data store 940. The server 912 may be part of a modeling system 910. The modeling system 910 may further include server machines 970 and 980.

Manufacturing equipment 924 (e.g., associated with producing, by manufacturing equipment 924, corresponding products, such as wafers) may include one or more processing chambers 926.

The client device 920, manufacturing equipment 924, metrology equipment 928, server 912, data store 940, server machine 970, and server machine 980 may be coupled to each other via a network 930 for modeling process results and plasma source configurations (e.g., for improving process uniformity of substrate processing within processing chambers 926).

In some embodiments, network 930 is a public network that provides client device 920 with access to the server 912, data store 940, and/or other commonly available computing devices. In some embodiments, network 930 is a private network that provides client device 920 access to manufacturing equipment 924, metrology equipment 928, data store 940, and/or other privately available computing devices. Network 930 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 920 may include a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. The client device 920 may include a plasma source configuration component 922. Recombination component 922 may receive data from metrology equipment 928 such as process result data and displays the process result data on the client device 920. The plasma source configuration component 922 may interact with one or more element of modeling system 910 to determine one or more plasma source configurations (e.g.,) to be disposed within processing chamber 926 to process a substrate that meets threshold criteria (e.g., process uniformity requirements).

Data store 940 may be a memory (e.g., random access memory), a drive (e.g., a hard drive, a flash drive), a database system, or another type of component or device capable of storing data. Data store 940 may store one or more historical data 942 including process result data 944 and/or plasma source configuration data 946. In some embodiments, the historical data 942 may be used to train, validate, and/or test a machine learning model 990 of modeling system 910.

Modeling system 910 may include one or more computing devices such as a rackmount server, a router computer, a server computer, a personal computer, a mainframe computer, a laptop computer, a tablet computer, a desktop computer, etc. In some embodiments, modeling system 910 may include a predictive component 916. Predictive component 916 may take data retrieved from metrology equipment 928 to generate plasma source configuration data 946. The predictive component receives metrology data from metrology equipment 928. The metrology data may include a process result profile associated with a substrate processed in processing chamber 926. The predictive component determines (e.g., using model 990) a plasma source configuration. The plasma source configuration may include an arrangement of plasma generation cells (e.g., plasma generation cells 200 of FIG. 2) and/or an exposure pattern (e.g., activation duration/cadence of individual plasma generation cells). In some embodiments, the plasma source configuration include electrical connection arrangements to the plasma generating elements such as one or more of the plasma generation cells are arranged in zones, chained together to form an array, each cell is controlled independently one from another, and/or the like. The plasma source configuration may further include specifications of individual plasma generating elements (e.g., brightness, power, voltage, current, plasma generation capabilities, etc.) For example, a substrate processed in a processing chamber using the plasma source configuration results in a processed substrate having process results meeting threshold criteria (e.g., process uniformity requirements).

In some embodiments, the predictive component 916 may use historical data 942 to determine a recombination configuration that when applied to a processing chamber results in a substrate processed in the chamber that meet threshold criteria (e.g. process uniformity requirements). In some embodiments, the predictive component 916 may use a model 990 (e.g. trained machine learning model) to identify plasma source configurations when utilized by a processing chamber result in a substrate with process results meeting a threshold condition (e.g., process uniformity requirements). The model 990 may use historical data to determine the recombination configurations.

In some embodiments, the modeling system 910 further includes server machine 970 and server machine 980. The server machine 970 and 980 may be one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components.

Server machine 970 may include a data set generator 972 that is capable of generating data sets (e.g., a set of data inputs and a set of target outputs) to train, validate, or test a machine learning model.

Server machine 980 includes a training engine 982, a validation engine 984, and a testing engine 986. The training engine 982 may be capable of training a model 990 (e.g., machine learning model) using one or more process result data 944 and surface material configuration data 946. The validation engine 984 may determine an accuracy of each of models 990 based on a corresponding set of features of each training set. The validation engine 984 may discard models 990 that have an accuracy that does not meet a threshold accuracy. The testing engine 986 may determine a model 990 that has the highest accuracy of all of the trained machine learning models based on the testing (and, optionally, validation) sets.

In some embodiments, the training data is provided to train the model 990 such that the trained machine learning model is to receive a new input having new metrology data comprising a process result profile and to produce a new output based on the new input, the new output indicating a new plasma source configuration. The plasma source configuration may include an arrangement of plasma generation cells (e.g., plasma generation cells 200 of FIG. 2) and/or an exposure pattern (e.g., activation duration/cadence of individual plasma generation cells). In some embodiments, the plasma source configuration include electrical connection arrangements to the plasma generating elements such as one or more of the plasma generation cells are arranged in zones, chained together to form an array, each cell is controlled independently one from another, and/or the like. The plasma source configuration may further include specifications of individual plasma generating elements (e.g., brightness, power, voltage, current, plasma generation capabilities, etc.) For example, a substrate processed in a processing chamber using the plasma source configuration results in a processed substrate having process results meeting threshold criteria (e.g., process uniformity requirements).

The model 990 may refer to the model that is created by the training engine 982 using a training set that includes data inputs and corresponding target output (historical results of cell cultures under parameters associated with the target inputs). Patterns in the data sets can be found that map the data input to the target output (e.g. identifying connections between portions of the cell growth data and resulting yield of the target product formation), and the machine learning model 990 is provided mappings that captures these patterns. The machine learning model 990 may use one or more of logistic regression, syntax analysis, decision tree, or support vector machine (SVM). The machine learning may be composed of a single level of linear of non-linear operations (e.g., SVM) and/or may be a neural network.

The confidence data may include or indicate a level of confidence of one or more plasma source configurations that when a substrate process a substrates according to the plasma source configuration will result in a substrate having process results that meets threshold criteria (e.g., process uniformity requirements). In one non-limiting example, the level of confidence is a real number between 0 and 1 inclusive, where 0 indicates no confidence of the one or more prescriptive actions and 1 represents absolute confidence in the prescriptive action.

For purpose of illustration, rather than limitation, aspects of the disclosure describe the training of a machine learning model and use of a trained learning model using information pertaining to historical data 942. In other implementation, a heuristic model or rule-based model is used to determine a prescriptive action. In some embodiments, model 990 including physics-based element or derive prediction through physics-based principles. For example, model 990 may include a physics-based model based on plasma and flow equations, principles, and/or simulations.

In some embodiments, the functions of client devices 920, server 912, data store 940, and modeling system 910 may be provided by a fewer number of machines than shown in FIG. 9. For example, in some embodiments, server machines 970 and 980 may be integrated into a single machine, while in some other embodiments, server machine 970 and 980 and server 912 may be integrated into a single machine.

In general, functions described in one embodiment as being performed by client device 920, data store 940, metrology system 928, manufacturing equipment 924, and modeling system 910 can also be performed on server 912 in other embodiments, if appropriate. In addition, the functionality attributed to a particular component can be performed by different or multiple components operating together.

In embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 10:
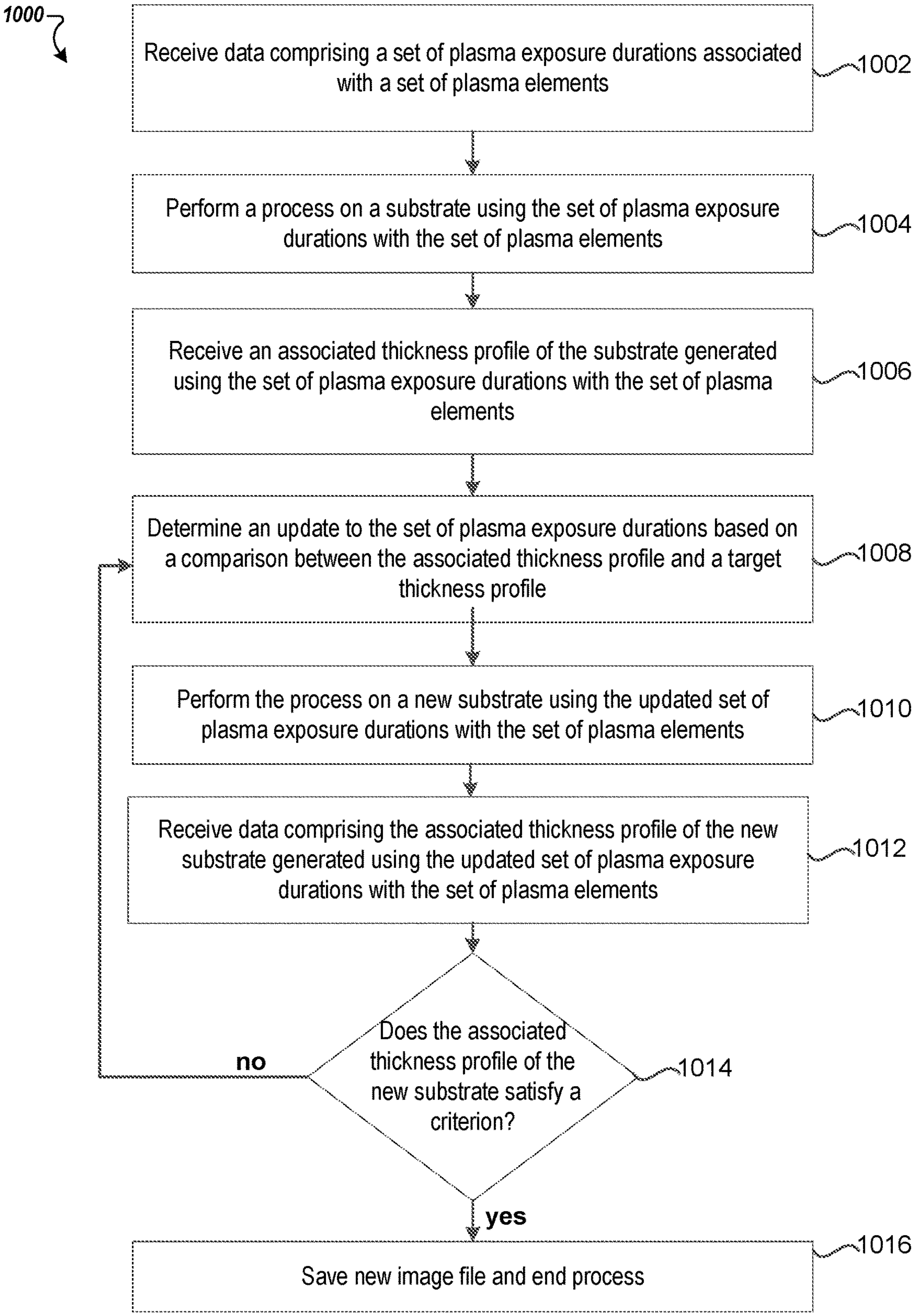
FIG. 10 is a flow chart of a method for tuning a plasma process, according to aspects of the disclosure.

FIG. 10 is a flow chart of a method 1000 for tuning a plasma process, according to aspects of the disclosure. Referring to FIG. 10, at block 1002, processing logic receives data including a set of plasma exposure durations associated with a set of plasma elements. In some embodiments, the data is received in the form of an exposure pattern comprising "brightness" values that correspond with exposure duration for each of the plasma elements. For example, the plasma elements (e.g., plasma generation cells 500 of FIG. 5) can be represented as nodes (i, k) indicative of their relative location to each other and the exposure pattern may comprises values that map to individual plasma elements and correspond to a total exposure duration for each plasma elements.

At block 1004, processing logic performs a process on a substrate using a set of plasma exposure durations with the set of plasma elements. The plasma elements may be configured to generate plasma related fluxes. In some embodiments, the set of plasma exposure durations include an amount of time $t_{ik}$ an associated plasma element exposes the first substrate to the plasma related fluxes generated by the associated plasma elements. In other embodiments, the first data further include a process time duration indicative of a total amount of time to perform a substrate process operation on the first substrate. Any of the set of plasma exposure durations may include a percentage value of the process time duration. In some embodiments, the set of plasma exposure duration include a quantity of plasma pulses $N_{ik}$ an associated plasma element (i, k) exposes the first substrate to during a plasma process.

As previously noted, in some embodiments, the first data may be stored as an exposure pattern with a set of plasma exposure durations. The set of plasma exposure durations may be stored as an array or map having at least one of brightness value or color values indicative of the exposure duration. Processing the data may include converting the exposure pattern to instructions for electrical devices to provide signals to the plasma generation cells.

In some embodiments, the data received is in the form of an exposure pattern, t(x, y) on a substrate through an image file or exposure map. For example, for digitally controlled plasma generation cells, the process result thickness (growth film, etch depth, etc.) is a function of space and time $h(x_i, y_k, t) \equiv h_{ik}(t)$, where $t=t(i, k)=t_{ik}$ is the ON time for the source positioned in the (i, k) node. Using file $\dot{h}_{ik} \equiv dh_{ik}/dt$ and the fact that $$\frac{\delta |h|}{\delta t} > 0,$$

the exposure time $t_{ik}$ can be adjusted in every node (i, k) to achieve a process profile $h_0(x, y)$. This time $t_{ik}$ is an exposure image that can constitute the data to be received at block 1002.

At block 1006, processing logic receives data comprising the set of plasma exposure durations and the associated thickness profile of the substrate generated using the set of plasma exposure durations with the set of plasma elements. In some embodiments, the thickness profile may include a thickness of a film taken in a few points measured across the substrate (e.g. 49 locations across the substrate). The thickness profile may then be extrapolated to represent the thickness across the surface of the substrate in areas not disposed away from the measured locations. The thickness profile, or on-wafer result image, can include the process result (e.g. thickness of grown film, etch depth, etc.) as a function of coordinate h(r) interpolated to positions of the plasma elements (e.g. plasma mini-sources) $r_{ik}$:$h(r_{ik})=h(x_i, y_k) \equiv h_{ik}$. Independently of the position and number of actual measurement points, the dimension and coordinate of the process image array are the same as of the exposure image array $t(r_{ik})=t_{ik}$.

The thickness $h_{ik}(t)$ around a plasma generation cell (also known as a node) grows with time on (or number of pulses in DBD) in that node (i, k) to achieve the desired process image (DPI) H (x, y).

At block 1008, processing logic determines an update to the set of plasma exposure durations based on a comparison between the associated thickness profile and a target thickness profile. For example, a comparison can be drawn between the thickness profile $h_{ik}=k(t_{ik})$ with and the target thickness profile or DPI $H_{ik}$. Updates to various time durations $t_{ik}$ or quantity of plasma pulses $N_{ik}$ can be updated for the individual plasma generation cells (i, k).

At block 1010, processing logic performs the process on a new substrate using the updated set of plasma exposure durations with the set of plasma generation cells. In some embodiments, the process may be performed using the same equipment (e.g. plasma generation cells) with only the exposure durations changed.

At block 1012, processing logic receives data including the associated thickness profile of the new substrate generated using the updated set of plasma exposure durations with the set of plasma elements. The thickness profile receive in block 1006 may include the same features as the thickness profile received in block 1006.

At block 1014, processing logic determines whether the associated thickness profile of the new substrate satisfies a criterion. Responsive to determining that the associated thickness profile of the new substrate profile does satisfy a criterion, processing logic proceeds along the yes path to block 1016. Responsive to determining that the associated thickness profile of the new substrate profile does not satisfy a criterion, processing logic proceeds along the no path to block 1008. In some embodiments, the thickness profile $h_{ik}$ may satisfy the threshold criterion when the difference between $h_{ik}$ and desired process image (DPI) ($H_{ik}$) is within a threshold criterion. For example, each thickness value of the profile may be within a predetermined difference limits, process control limit, and/or statistical boundary.

At block 1016, processing logic save (e.g., stores locally) the new exposure pattern and ends the process.

In some embodiments, tuning is used for updating the total time (e.g. brightness) of the same exposure pattern. In some embodiments, tuning is used to update the exposure pattern, keeping the same total time, and in some embodiments, both the total time and exposure pattern may be updated. For example, tuning the total time or updating the exposure pattern may be used to update a process that is partially developed or stable. For example, updating a portion of the data (e.g. brightness or exposure pattern) may apply fine adjusting such as accounting for slow process drift during normal fabrication operations. In this embodiments, a test wafer can be used.

In some embodiments, measuring of the substrate (e.g. determine the thickness profiles that are received at blocks 1006 and 1010) may be performed after a processing step is completed. For example the process result (e.g., thickness profile change) may be ascertained outside of a processing chamber or location proximate a plasma source. However, in other embodiments techniques for in-situ process development can be used to make on-demand adjustments to a fabrication process. For example, a specific location on a substrate may be monitored live to actively determine any process updates to meet a desired outcome (e.g. process image) at the monitored location of the substrate.

In some embodiments an initial exposure pattern is unknown, thus the total process time $t_{pr}$ is unknown. A uniform exposure pattern ($t(i, k)=t_{pr}$) can be used as a starting point (e.g. at block 1002 and 1004).

Figure 11:
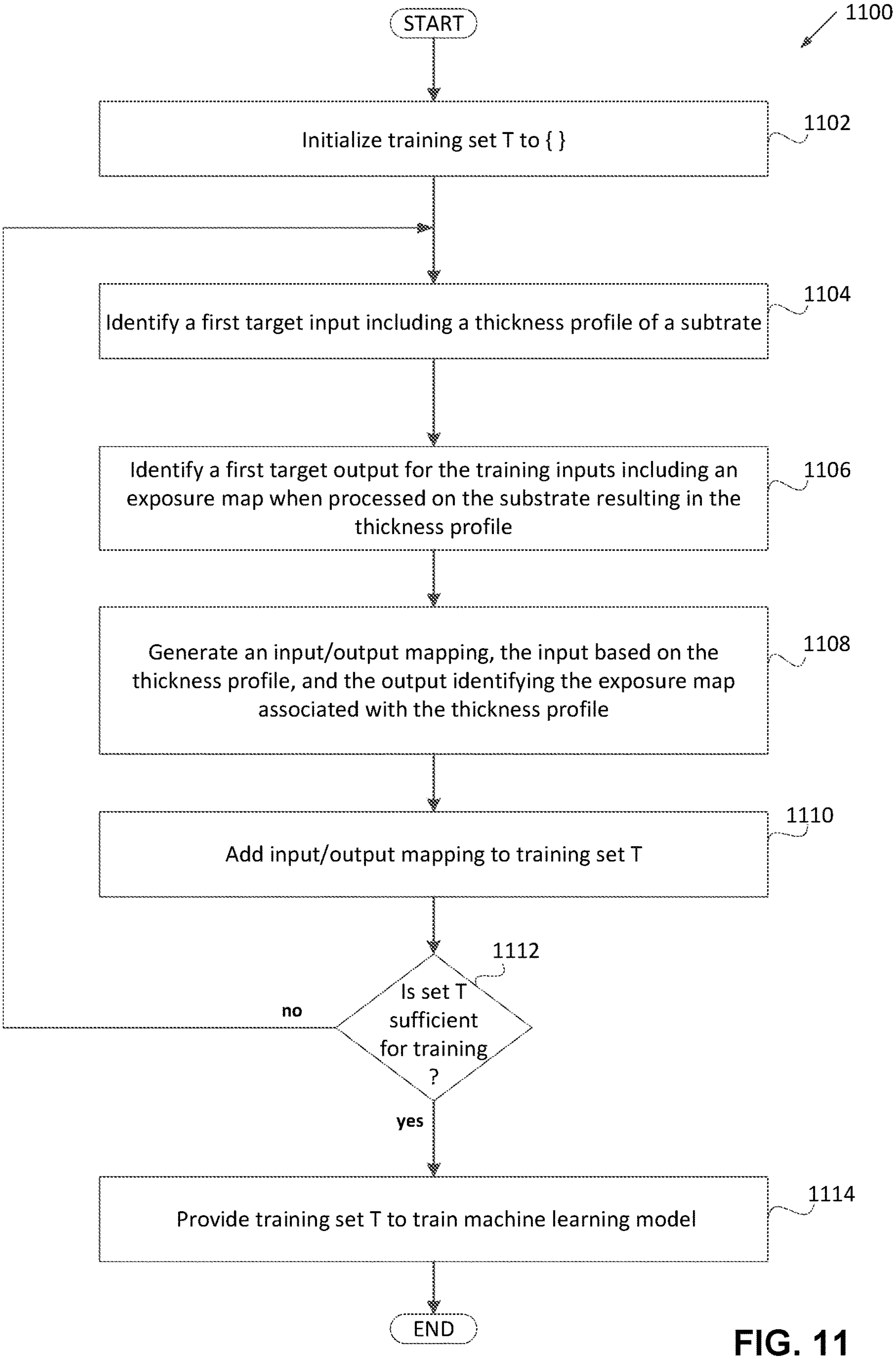
FIG. 11 is an exemplary illustration of a training phase of a machine learning model, according to aspects of the disclosure.

FIG. 11 is an exemplary illustration of a training phase of a machine learning model, according to aspects of the disclosure. A system such as a modeling system 910 may use method 1100 to at least one of train, validate, or test a machine learning model, in accordance with embodiments of the disclosure. In some embodiments, one or more operations of method 1100 may be performed by a data set generator of a computing device (e.g., server 912). It may be noted that components described with respect to FIGS. 1-9 may be used to illustrate aspects of FIG. 11. In some embodiments, machine learning is performed to determine the interaction between plasma elements of a digital plasma system and how changes in how long a particular plasma element is active (or open) affects both a region of a substrate that is associated with that particular plasma element as well as regions of the substrate that are proximate to the region associated with the particular plasma element.

For example, the ON time for a plasma element may most strongly impact a region of a substrate that is directly under that plasma element. However, the ON time for that plasma element may also affect regions that are not directly under the plasma element but that are around the region that is directly under the plasma element. As a result, increasing or decreasing the ON time for a particular plasma element has effects on multiple regions of a substrate. Thus, when a first plasma element ON time is reduced to lower an amount of plasma flux that reaches a particular region, this may also reduce the amount of plasma flux that reaches surrounding regions, and thus it may be appropriate to also increase the ON time for one or more other plasma elements associated with the surrounding regions. However, such change in those plasma elements may increase a flux on still other regions, which may warrant changing the ON time of still other plasma elements associated with those regions. Accordingly, in embodiments a model is generated that can be used to determine what adjustments to make to a recipe run on a particular process chamber based on a thickness profile of a substrate processed on the process chamber.

Referring to FIG. 11, in some embodiments, at block 1102 the processing logic implements method 1100 and initializes a training set T to an empty set.

At block 1104, processing logic identifies a first data input (e.g. first training input, first validating input) that includes a thickness profile of a substrate. The first data input may include a thickness profile including one or more thickness values of film on a substrate measured at various location across a surface of the substrate.

At block 1106, processing logic identifies a first target output for one or more of the data inputs (e.g., first data input). The first target output includes an exposure map (e.g. image file or exposure duration data) that when processed by a plasma delivery system results in the thickness profile used as the first target input.

At block 1108, processing logic optionally generates mapping data that is indicative of an input/output mapping. The input/output mapping (or mapping data) may refer to the data input (e.g., one or more of the data inputs described herein), the target output for the data input (e.g. one or more of the data inputs described herein), the target output for the data (e.g. where the target output identifies an exposure map and/or image), and an association between the data input(s) and the target output.

At block 1110, processing logic adds the mapping data generated at block 1104 to data set T.

At block 1112, processing logic branches based on whether the data set T is sufficient for at least one of training, validating, or testing a machine learning model. If so ("yes" branch), execution proceeds to block 1114, otherwise ("no" branch), execution continues back at block 1104. It should be noted that in some embodiments, the sufficiency of data set T may be determined based simply on the number of input/output mappings and/or the number of labeled exposure maps in the data set, while in some other embodiments, the sufficiency of data set T may be determined based on one or more other criteria (e.g., a measure of diversity of the data examples, accuracy, etc.) in addition to, or instead of, the number of input/output mappings.

At block 1114, processing logic provides data set T to train, validate, or test machine learning model. In some embodiments, data set T is a training set and is provided to a training engine to perform the training. In some embodiments, data set T is a validation set and is provided to a validation engine to perform the validating. In some embodiments, data set T is a testing set and is provided to a testing engine to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 1114, a machine learning model can be at least one of trained using a training engine, validated using a validating engine, or tested using a testing engine.

In embodiments, a training dataset that was generated (e.g., as generated according to method 1100) is used to train a machine learning model and/or a physical model. The model may be trained to receive as an input a thickness profile or thickness map as measured from a substrate that was processed by a process chamber using a plasma process and/or an exposure map of exposure settings for plasma elements of the process chamber that were used during the process that resulted in the thickness profile or thickness map that was generated. The model may output an exposure map (e.g., an updated exposure map) that indicates exposure settings to use for each plasma element for future iterations of the process on the process chamber. In embodiments, the model may be agnostic to process chambers and/or to process recipes. Accordingly, the model may be generated based on training data items generated based on processes run on a first process chamber or first set of process chambers, and may then be used for a second process chamber without performing any transfer learning to tune the model for the second process chamber. Once the model is generated, any thickness profile and/or exposure map may be input into the model regardless of which specific process chamber was used to perform a process that resulted in the thickness profile, and the model may output an exposure map that indicates which plasma element settings to use to result in a uniform plasma etch and/or a uniform plasma-enhanced deposition. The exposure map may be input into a process chamber along with a process recipe, and the process chamber may execute the process recipe with adjustments based on the exposure map. For example, the exposure map may indicate, for each plasma element of a digital plasma source, what percentage of a time set forth in the recipe that the plasma element should be on or open during the process.

In one embodiment, the trained machine learning model is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, leas absolute deviations, nonparametric regression, scenario optimization and/or distance metric learning may be performed to train the regression model.

In one embodiment, the trained machine learning model is a decision tree, a random forest model, a support vector machine, or other type of machine learning model.

In one embodiment, the trained machine learning model is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

The trained machine learning model may be periodically or continuously retrained to achieve continuous learning and improvement of the trained machine learning model. The model may generate an output based on an input, an action may be performed based on the output, and a result of the action may be measured. In some instances the result of the action is measured within seconds or minutes, and in some instances it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input (e.g., thickness profile), the output of the trained machine learning model (e.g., exposure map), and the target result (e.g., target thickness profile) actual measured result (e.g., measured thickness profile) may be used to generate a new training data item. The new training data item may then be used to further train the trained machine learning model. This retraining process may be performed on-tool on the controller of the process chamber in embodiments.

Figure 12:
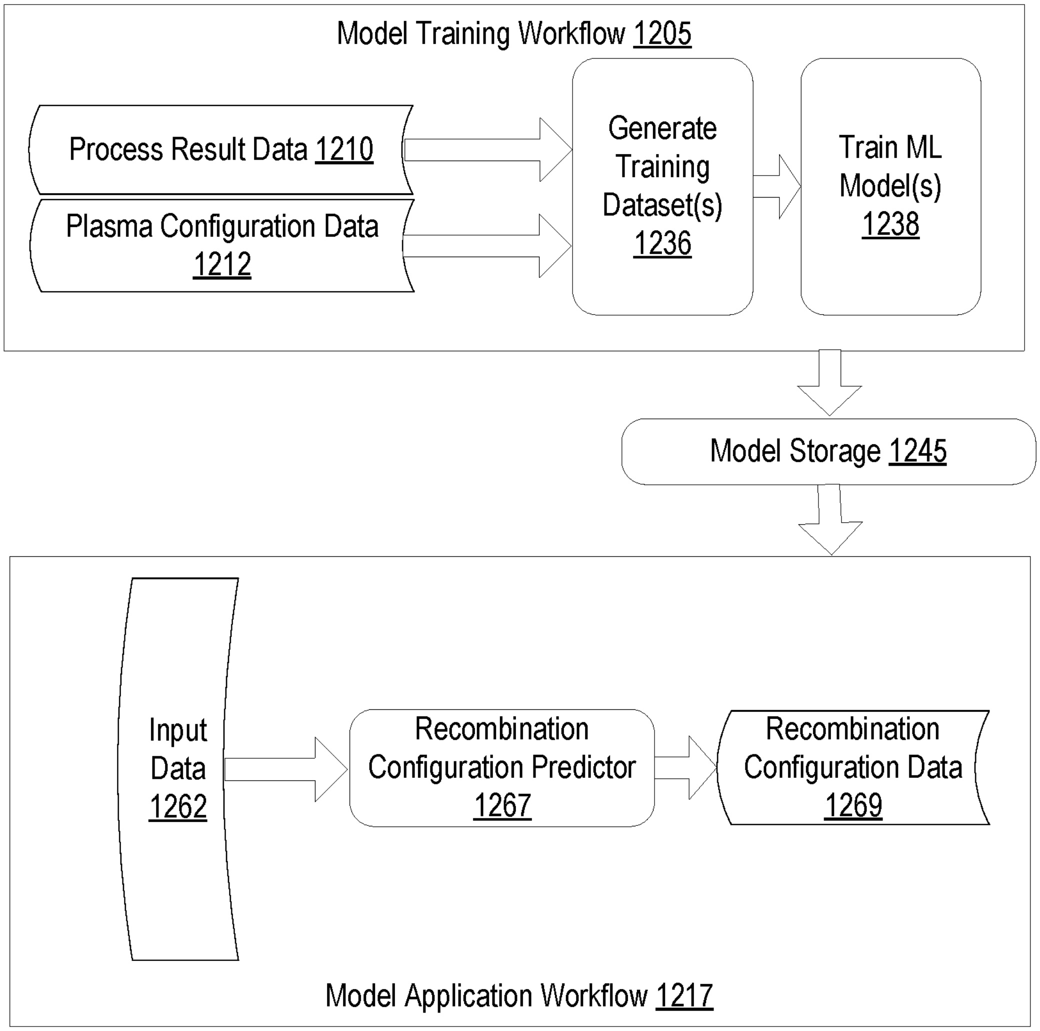
FIG. 12 illustrates a model training workflow and a model application workflow for plasma source configurations, in accordance with an embodiment of the present disclosure.

FIG. 12 illustrates a model training workflow 1205 and a model application workflow 1217 for plasma source configurations, in accordance with an embodiment of the present disclosure. In embodiments, the model training workflow 1205 may be performed at a server which may or may not include a plasma source configuration application, and the trained models are provided to a plasma source configuration application (e.g., on client device 920 of FIG. 9), which may perform the model application workflow 1217. The model training workflow 1205 and the model application workflow 1217 may be performed by processing logic executed by a processor of a computing device. One or more of these workflows 1205, 1217 may be implemented, for example, by one or more machine learning modules implemented by server 912 of FIG. 9.

The model training workflow 1205 is to train one or more machine learning models (e.g., deep learning models) to perform one or more classifying, segmenting, detection, recognition, decision, etc. tasks associated with a plasma source configuration predictor. The model application workflow 1217 is to apply the one or more trained machine learning models to perform the classifying, segmenting, detection, recognition, determining, etc. tasks for identifying configuration of a plasma generation elements (e.g., plasma source configurations). One or more of the machine learning models may receive and process result data (e.g., metrology data of processed wafers) and plasma source configuration data.

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained ML model is a single shared neural network that has multiple shared layers and multiple higher level distinct output layers, where each of the output layers outputs a different prediction, classification, identification, etc. The tasks that the one or more trained machine learning models may be trained to perform are as follows:

1. Plasma source configuration predictor—As discussed previously, relationships between plasma source configuration (e.g., dispositions/arrangements of plasma generation cells) and process results (e.g., film thickness, uniformity, etc.) may be employed to predict plasma source configurations that when utilized within a processing chamber result in substrate processed within the processing chamber having process results that meet a threshold criteria (e.g., process uniformity requirements). The plasma source configuration predictor receives data indicative of a process result profile and outputs a first update to a plasma source configuration (e.g., altering an exposure duration of the one or more plasma generation cells, replacing one or more plasma generation cells).

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The “deep” in “deep learning” refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

For the model training workflow 705, a training dataset containing hundreds, thousands, tens of thousands, hundreds of thousands or more process result data 710 (e.g., process result profiles, thickness profiles) should be used to form a training dataset. In embodiments, the training dataset may also include associated recombination configuration data 712 for forming a training dataset, where each data point and/or associated recombination configuration may include various labels or classifications of one or more types of useful information. This data may be processed to generate one or multiple training datasets 636 for training of one or more machine learning models.

In one embodiment, generating one or more training datasets 636 includes gathering one or more process result measurements (e.g., metrology data) of processed substrates processed in chambers with varying recombination configurations disposed on the chamber walls of the associated chambers.

To effectuate training, processing logic inputs the training dataset(s) 736 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

Training may be performed by inputting one or more of the process result data 1210 and recombination configuration data 1212 into the machine learning model one at a time. In some embodiments, the training of the machine learning model includes tuning the model to receive process result data 1210 (e.g., process result profiles, thickness profiles of processed substrates) and output a plasma configuration prediction (e.g., one or more alteration to a plasma source configuration). The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include a determined plasma source configuration. Processing logic may cause a substrate to be process using the plasma source configuration and receive an updated thickness profile. The plasma source configuration may include an arrangement of plasma generation cells (e.g., plasma generation cells 200 of FIG. 2) and/or an exposure pattern (e.g., activation duration/cadence of individual plasma generation cells). In some embodiments, the plasma source configuration include electrical connection arrangements to the plasma generating elements such as one or more of the plasma generation cells are arranged in zones, chained together to form an array, each cell is controlled independently one from another, and/or the like. The plasma source configuration may further include specifications of individual plasma generating elements (e.g., brightness, power, voltage, current, plasma generation capabilities, etc.) For example, a substrate processed in a processing chamber using the plasma source configuration results in a processed substrate having process results meeting threshold criteria (e.g., process uniformity requirements).

Processing logic may compare the updated thickness profile against a target thickness profile and determine whether a threshold criterion is met (e.g., thickness values measured across a surface of the wafer fall within a target threshold value window). Processing logic determines an error (i.e., a classification error) based on the differences between the updated thickness profile and the target thickness profile. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criteria are met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

As an example, in one embodiment, a machine learning model (e.g., recombination configuration predictor 1267) is trained to determine plasma source configurations (e.g., arrangement of plasma generation cells and/or plasma exposure duration for the plasma generation cells to process a substrate to meet threshold criteria (e.g., process uniformity requirements)). A similar process may be performed to train machine learning models to perform other tasks such as those set forth above. A set of many (e.g., thousands to millions) process results profiles (e.g., thickness profiles) may be collected and recombination configurations (e.g., surface material configurations within a process chamber) may be determined.

Once one or more trained machine learning models 1238 are generated, they may be stored in model storage 1245, and may be added to a plasma source configuration application. The plasma source configuration application may then use the one or more trained ML models 1238 as well as additional processing logic to implement an automatic mode, in which user manual input of information is minimized or even eliminated in some instances.

For model application workflow 1217, according to one embodiment, input data 1262 may be input into plasma source configuration predictor 1267, which may include a trained neural network. Based on the input data 1262, plasma source configuration predictor 1267 outputs information indicating an updated plasma source configuration and/or updates to a previous plasma source configuration. The plasma source configuration may include an arrangement of plasma generation cells (e.g., plasma generation cells 200 of FIG. 2) and/or an exposure pattern (e.g., activation duration/cadence of individual plasma generation cells). In some embodiments, the plasma source configuration include electrical connection arrangements to the plasma generating elements such as one or more of the plasma generation cells are arranged in zones, chained together to form an array, each cell is controlled independently one from another, and/or the like. The plasma source configuration may further include specifications of individual plasma generating elements (e.g., brightness, power, voltage, current, plasma generation capabilities, etc.) For example, a substrate processed in a processing chamber using the plasma source configuration results in a processed substrate having process results meeting threshold criteria (e.g., process uniformity requirements).

Figure 13:
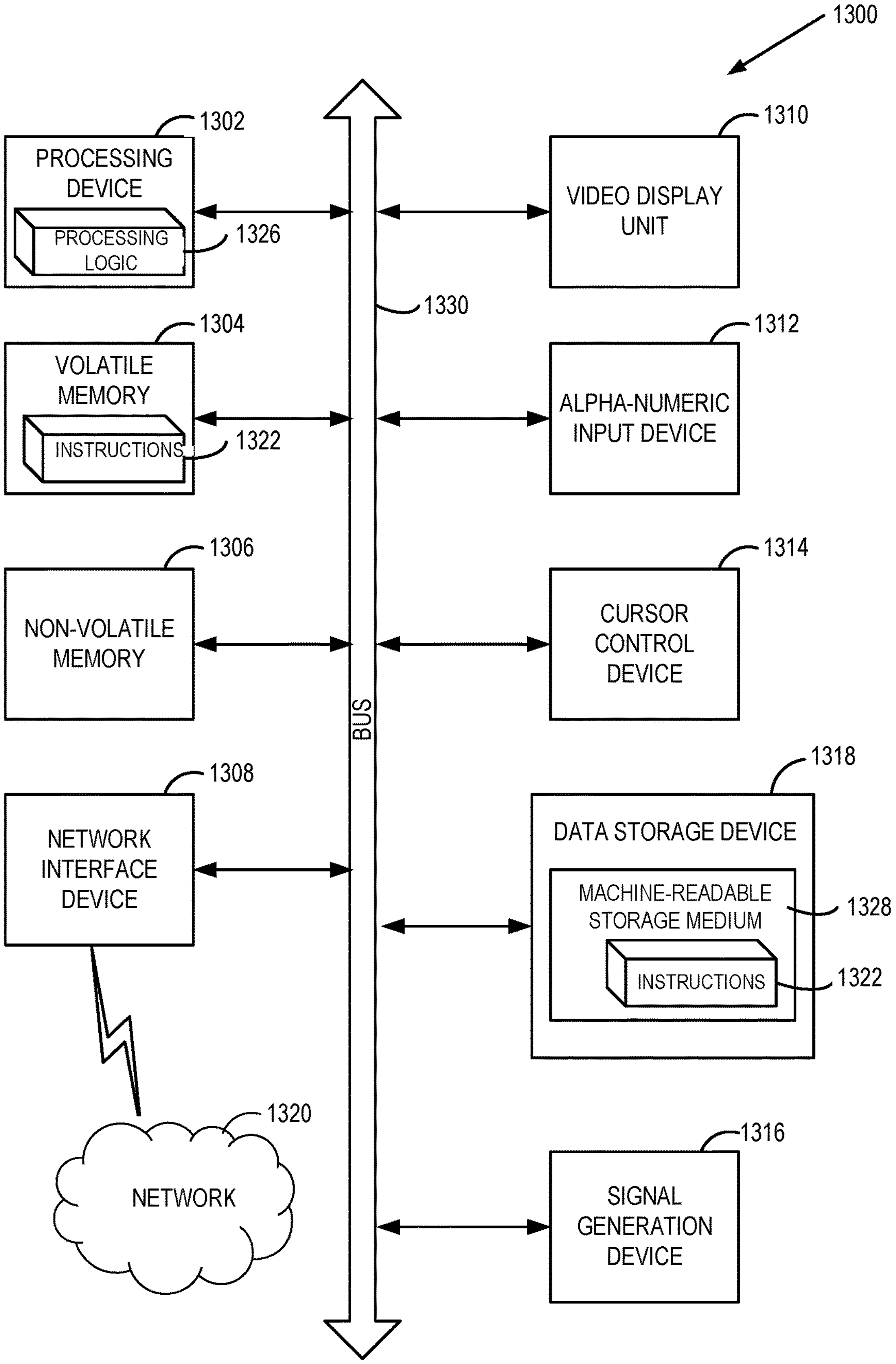
FIG. 13 depicts a block diagram of an example computing device capable of plasma delivery and/or processing, operating in accordance with one or more aspects of the disclosure.

FIG. 13 depicts a block diagram of an example computing device 1300 capable of plasma delivery and/or processing, operating in accordance with one or more aspects of the disclosure. In various illustrative examples, various components of the computing device 1300 may represent various components of computing device (e.g. modeling system 910 of FIG. 9), the training engine, validation engine, and/or the testing engine described in association with FIG. 9.

Example computing device 1300 may be connected to other computer devices in a LAN, an intranet, an extranet, and/or the Internet. Computing device 1300 may operate in the capacity of a server in a client-server network environment. Computing device 1300 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 1300 may include a processing device 1302 (also referred to as a processor or CPU), a main memory 1304 (e.g., read-only memory (ROM), flash memory, dynamic random access memory (DRAM) such as synchronous DRAM (SDRAM), etc.), a static memory 1306 (e.g., flash memory, static random access memory (SRAM), etc.), and a secondary memory (e.g., a data storage device 1318), which may communicate with each other via a bus 1330.

Processing device 1302 represents one or more general-purpose processing devices such as a microprocessor, central processing unit, or the like. More particularly, processing device 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. In accordance with one or more aspects of the disclosure, processing device 1302 may be configured to execute instructions implementing methods 1000-1100 illustrated in FIGS. 10-11.

Example computing device 1300 may further comprise a network interface device 1308, which may be communicatively coupled to a network 1320. Example computing device 1300 may further comprise a video display 1310 (e.g., a liquid crystal display (LCD), a touch screen, or a cathode ray tube (CRT)), an alphanumeric input device 1312 (e.g., a keyboard), a cursor control device 1314 (e.g., a mouse), and an acoustic signal generation device 1316 (e.g., a speaker).

Data storage device 1318 may include a machine-readable storage medium (or, more specifically, a non-transitory machine-readable storage medium) 1328 on which is stored one or more sets of executable instructions 1322. In accordance with one or more aspects of the disclosure, executable instructions 1322 may comprise executable instructions associated with executing methods 1000-1100 illustrated in FIGS. 10-11.

Executable instructions 1322 may also reside, completely or at least partially, within main memory 1304 and/or within processing device 1302 during execution thereof by example computing device 1300, main memory 1304 and processing device 1302 also constituting computer-readable storage media. Executable instructions 1322 may further be transmitted or received over a network via network interface device 1308.

While the computer-readable storage medium 1328 is shown in FIG. 13 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the disclosure is not limited to any particular programming language. It will be appreciated that a variety of programming languages may be used to implement the teachings of the disclosure.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure may be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A plasma processing system, comprising:

a processing chamber configured to house a substrate within a first region of the processing chamber;

a support structure disposed within the processing chamber, the support structure forming a set of ducts;

at least one plasma generation cell selectively removable from and selectively replaceable within the support structure, the plasma generation cell coupled to the support structure by at least one of a friction fit, quick release coupling, compression nut, threaded connector, or elastomeric member, the plasma generation cell comprising:

a dielectric barrier discharge (DBD) structure comprising a set of electrodes disposed along a first dielectric surface and covered by a second dielectric layer, wherein the DBD structure is configured to initiate plasma discharge within the processing chamber;

a stem structure comprising a longitudinal body comprising an insulating material and extending through the support structure to a position outside the processing chamber, the stem structure configured to interface with one duct of the set of ducts; and electrical terminals configured to couple the DBD structure with an electric driving network through an upper face of the stem structure, opposite the DBD structure, wherein the electrical terminals are routed through an interior of the longitudinal body of the stem structure and extend from an end of the stem structure; and a connection structure disposed over the support structure and forming a second set of ducts, wherein the stem structure extends through one duct of the set of ducts of the support structure and through one duct of the second set of ducts of the connection structure.

2. The plasma processing system of claim 1, wherein the at least one plasma generation cell is a plurality of plasma generation cells, wherein each of the plurality of plasma generation cells is selectively removable from and selectively replaceable within the support structure.

3. The plasma processing system of claim 1, wherein:

each of the set of electrodes is covered by a third dielectric layer positioned on a first end of the DBD structure;

the third dielectric layer is configured to operate in vacuum conditions of the processing chamber; and the electrical terminals extend from the upper face of the stem structure.

4. The plasma processing system of claim 3, wherein the stem structure extends through the support structure and away from the processing chamber, and wherein each of the electrical terminals is configured to extend to a position outside the processing chamber under atmospheric pressure.

5. The plasma processing system of claim 3, wherein the DBD structure forms a cavity and comprises an interior surface forming a boundary of the cavity, wherein each of the set of electrodes is disposed on the interior surface.

6. The plasma processing system of claim 3, wherein the electrical terminals are disposed on the first dielectric surface, and wherein a portion of one or more electrodes extends to a position outside the processing chamber.

7. The plasma processing system of claim 6, further comprising a fourth dielectric layer disposed on the portion of the one or more electrodes extending to the position outside the processing chamber.

* * * * *